(12) United States Patent
Fujii et al.

(10) Patent No.: US 11,587,857 B2
(45) Date of Patent: *Feb. 21, 2023

(54) SEMICONDUCTOR DEVICE

(71) Applicant: Sony Corporation, Tokyo (JP)

(72) Inventors: Nobutoshi Fujii, Kanagawa (JP); Yoshihisa Kagawa, Kanagawa (JP)

(73) Assignee: SONY CORPORATION, Tokyo (JP)

(*) Notice: Subject to any disclaimer, the term of this patent is extended or adjusted under 35 U.S.C. 154(b) by 253 days.

This patent is subject to a terminal disclaimer.

(21) Appl. No.: 15/945,579

(22) Filed: Apr. 4, 2018

(65) Prior Publication Data
US 2018/0233435 A1 Aug. 16, 2018

Related U.S. Application Data

(63) Continuation of application No. 15/711,607, filed on Sep. 21, 2017, now Pat. No. 10,236,238, which is a
(Continued)

(51) Int. Cl.
*H01L 27/146* (2006.01)
*H01L 23/498* (2006.01)
(Continued)

(52) U.S. Cl.
CPC ...... *H01L 23/498* (2013.01); *H01L 23/49866* (2013.01); *H01L 23/522* (2013.01);
(Continued)

(58) Field of Classification Search
CPC ... H01L 23/49866; H01L 24/05; H01L 24/06; H01L 24/08; H01L 25/0657; H01L 25/50;
(Continued)

(56) References Cited

U.S. PATENT DOCUMENTS 4,939,568 A 7/1990 Kato et al.
5,563,084 A 10/1996 Ramm et al.
(Continued)

FOREIGN PATENT DOCUMENTS

CN 101996956 3/2011
JP S62-173752 7/1987
(Continued)

OTHER PUBLICATIONS

Deptuch et al., "Vertically Integrated Circuits at Fermilab," IEEE Transactions on Nuclear Science, 2010, vol. 57, No. 4, pp. 2178-2186.
(Continued)

*Primary Examiner* — Jarrett J Stark
(74) *Attorney, Agent, or Firm* — Sheridan Ross P C.

(57) ABSTRACT

A first semiconductor device includes: a first wiring layer including a first interlayer insulating film, a first electrode pad, and a first dummy electrode, the first electrode pad being embedded in the first interlayer insulating film and having one surface located on same plane as one surface of the first interlayer insulating film, and the first dummy electrode being embedded in the first interlayer insulating film, having one surface located on same plane as the one surface of the first interlayer insulating film, and being disposed around the first electrode pad; and a second wiring layer including a second interlayer insulating film, a second electrode pad, and a second dummy electrode, the second electrode pad being embedded in the second interlayer insulating film, having one surface located on same surface as one surface of the second interlayer insulating film, and being bonded to the first electrode pad, and the second dummy electrode having one surface located on same plane as the surface located closer to the first interlayer insulating film of the second interlayer insulating film, being disposed
(Continued)

around the second electrode pad, and being bonded to the first dummy electrode. A second semiconductor device includes: a first semiconductor section including a first electrode, the first electrode being formed on a surface located closer to a bonding interface and extending in a first direction; and a second semiconductor section including a second electrode and disposed to be bonded to the first semiconductor section at the bonding interface, the second electrode being bonded to the first electrode and extending in a second direction that intersects with the first direction.

20 Claims, 13 Drawing Sheets

Related U.S. Application Data continuation of application No. 14/116,432, filed as application No. PCT/JP2012/062484 on May 16, 2012, now Pat. No. 9,799,587.

(51) Int. Cl.
*H01L 23/522* (2006.01)
*H01L 23/00* (2006.01)
*H01L 25/065* (2023.01)
*H01L 25/00* (2006.01)
*H01L 23/532* (2006.01)

(52) U.S. Cl.
CPC ........ *H01L 23/53238* (2013.01); *H01L 24/05* (2013.01); *H01L 24/06* (2013.01); *H01L 24/08* (2013.01); *H01L 24/09* (2013.01); *H01L 25/0657* (2013.01); *H01L 25/50* (2013.01); *H01L 27/1464* (2013.01); *H01L 27/14634* (2013.01); *H01L 27/14636* (2013.01); *H01L 24/80* (2013.01); *H01L 2224/05547* (2013.01); *H01L 2224/05571* (2013.01); *H01L 2224/0603* (2013.01); *H01L 2224/0616* (2013.01); *H01L 2224/06131* (2013.01); *H01L 2224/06133* (2013.01); *H01L 2224/06517* (2013.01); *H01L 2224/08123* (2013.01); *H01L 2224/08147* (2013.01); *H01L 2224/09517* (2013.01); *H01L 2224/80194* (2013.01); *H01L 2224/80357* (2013.01); *H01L 2224/80895* (2013.01); *H01L 2224/80896* (2013.01); *H01L 2225/06513* (2013.01); *H01L 2225/06565* (2013.01); *H01L 2924/00012* (2013.01); *H01L 2924/00014* (2013.01); *H01L 2924/01029* (2013.01); *H01L 2924/12043* (2013.01); *H01L 2924/13091* (2013.01)

(58) Field of Classification Search
CPC ........... H01L 27/14636; H01L 27/1464; H01L 23/522; H01L 2224/06517; H01L 2224/80357; H01L 2224/08147; H01L 24/80; H01L 2224/05571; H01L 2224/0603; H01L 2224/06131; H01L 2224/06133; H01L 2224/0616; H01L 2224/80895; H01L 2224/80896; H01L 2225/06513; H01L 2225/06565

See application file for complete search history.

(56) References Cited

U.S. PATENT DOCUMENTS

| | | | |
|---|---|---|---|
| 6,355,501 B1 | 3/2002 | Fung et al. | |
| 6,455,398 B1 | 9/2002 | Fonstad et al. | |
| 6,596,640 B1 | 7/2003 | Fischer et al. | |
| 6,600,173 B2 | 7/2003 | Tiwari | |
| 6,841,883 B1 | 1/2005 | Farnworth et al. | |
| 6,962,835 B2 | 11/2005 | Tong et al. | |
| 7,052,941 B2 | 5/2006 | Lee | |
| 7,358,578 B2 | 4/2008 | Iwasaki et al. | |
| 8,044,946 B2 | 10/2011 | Yamazaki et al. | |
| 8,148,728 B2 | 4/2012 | Or-Bach et al. | |
| 8,629,524 B2* | 1/2014 | Wang | H01L 27/14618 257/432 |
| 9,425,155 B2 | 8/2016 | Liu et al. | |
| 9,443,836 B2* | 9/2016 | Chen | H01L 25/18 |
| 9,799,587 B2 | 10/2017 | Fujii et al. | |
| 10,236,238 B2 | 3/2019 | Fujii et al. | |
| 2002/0003307 A1 | 1/2002 | Suga | |
| 2003/0148590 A1 | 8/2003 | Kellar et al. | |
| 2003/0157748 A1 | 8/2003 | Kim et al. | |
| 2004/0089915 A1 | 5/2004 | Nanjo et al. | |
| 2005/0082577 A1 | 4/2005 | Usui et al. | |
| 2005/0224921 A1 | 10/2005 | Gupta et al. | |
| 2005/0280120 A1* | 12/2005 | Tomita | H01L 23/522 257/620 |
| 2006/0103017 A1 | 5/2006 | Usui et al. | |
| 2006/0121690 A1 | 6/2006 | Pogge et al. | |
| 2007/0057384 A1 | 3/2007 | Alam et al. | |
| 2007/0087528 A1 | 4/2007 | Kim et al. | |
| 2007/0120241 A1 | 5/2007 | Trezza et al. | |
| 2007/0158787 A1 | 7/2007 | Chanchani | |
| 2007/0166997 A1 | 7/2007 | Knorr | |
| 2008/0163139 A1 | 7/2008 | Scheffer et al. | |
| 2008/0230923 A1 | 9/2008 | Jo | |
| 2008/0265138 A1 | 10/2008 | Uya | |
| 2009/0096061 A1* | 4/2009 | Uchida | H01L 23/5227 257/531 |
| 2009/0294912 A1 | 12/2009 | Chibahara | |
| 2010/0225774 A1* | 9/2010 | Enomoto | H01L 27/14603 348/222.1 |
| 2010/0238334 A1* | 9/2010 | Takahashi | H01L 27/1464 348/305 |
| 2010/0258890 A1* | 10/2010 | Ahn | H01L 27/14636 257/432 |
| 2010/0276572 A1 | 11/2010 | Iwabuchi et al. | |
| 2011/0031633 A1 | 2/2011 | Hsu et al. | |
| 2011/0042814 A1 | 2/2011 | Okuyama | |
| 2011/0248396 A1 | 10/2011 | Liu et al. | |
| 2012/0086067 A1 | 4/2012 | Sekar et al. | |
| 2013/0062777 A1 | 3/2013 | Ogata | |
| 2013/0099098 A1* | 4/2013 | Kobayashi | H01L 27/14609 250/208.1 |
| 2013/0284885 A1* | 10/2013 | Chen | H01L 25/16 250/208.1 |
| 2014/0042298 A1* | 2/2014 | Wan | H01L 27/14634 250/208.1 |
| 2014/0042299 A1* | 2/2014 | Wan | H01L 27/14634 250/208.1 |
| 2015/0235972 A1* | 8/2015 | Uchida | H01L 23/5227 257/664 |
| 2015/0243611 A1 | 8/2015 | Liu et al. | |
| 2016/0005781 A1* | 1/2016 | Lin | H01L 27/14643 257/292 |
| 2020/0066438 A1* | 2/2020 | Lee | H01L 28/10 |
| 2022/0246498 A1 | 8/2022 | Fujii et al. | |

FOREIGN PATENT DOCUMENTS

| | | |
|---|---|---|
| JP | H01-228202 | 9/1989 |
| JP | H11-150114 | 6/1999 |
| JP | H11-265866 | 9/1999 |
| JP | 2001-250913 | 9/2001 |
| JP | 2004-153015 | 5/2004 |
| JP | 3532788 | 5/2004 |
| JP | 2005-135988 | 5/2005 |
| JP | 2006-100301 | 4/2006 |
| JP | 2006-191081 | 7/2006 |
| JP | 2006-522461 | 9/2006 |
| JP | 2010-103533 | 5/2010 |
| JP | 2010-219425 | 9/2010 |
| JP | 2011-054637 | 3/2011 |

(56) References Cited

FOREIGN PATENT DOCUMENTS

| KR | 10-2007-0016987 | 2/2007 |
|---|---|---|
| KR | 10-2010-0048890 | 5/2010 |
| TW | 201106457 | 2/2011 |

OTHER PUBLICATIONS

Official Action (with English translation) for Korean Patent Application No. 10-2013-7028555, dated May 16, 2018.
Extended European Search Report for European Patent Application No. 19167410.0, dated Aug. 6, 2019, 13 pages.
Notice of Allowance for Korea Patent Application No. 10-2020-7005315, dated Dec. 30, 2020, 6 pages.
Official Action (no English translation available) for Taiwan Patent Application No. 109130275, dated Mar. 11, 2021, 5 pages.
Notice of Allowance (with English translation) for Korea Patent Application No. 10-2021-7007969, dated Dec. 22, 2021, 4 pages.
McMahon, et al., "Wafer Bonding of Damascene-Patterned Metal/Adhesive Redistribution Layers for Via-First Three-Dimensional (30) Interconnect", 2005 Electronic Components and Technology Conference.
Partial Supplementary European Search Report for Europe Patent Application No. 12790013, dated Dec. 3, 2014, 7 pages.
Extended Supplementary European Search Report for Europe Patent Application No. 12790013, dated Mar. 25, 2015, 7 pages.
Official Action (no English translation available) for Japan Patent Application No. 2011-129190, dated Mar. 17, 2015, 9 pages.
Official Action (with English translation) for China Patent Application No. 201280021467.3 dated Jul. 6, 2015, 10 pages.
Official Action (no English translation available) for China Patent Application No. 201610307746.6 dated Dec. 21, 2017, 12 pages.
Official Action (no English translation available) for Japan Patent Application No. 2011-115634 dated Sep. 1, 2015, 5 pages.
Official Action (no English translation available) for Japan Patent Application No. 2011-129190 dated Oct. 6, 2015, 6 pages.
Official Action (with English translation) for Korea Patent Application No. 110-2021-7007969, dated Jun. 14, 2021, 5 pages.
Official Action for U.S. Appl. No. 14/116,432, dated Oct. 24, 2014, 14 pages.
Official Action for U.S. Appl. No. 14/116,432, dated Jun. 10, 2015, 15 pages.
Official Action for U.S. Appl. No. 14/116,432, dated Sep. 25, 2015, 18 pages.
Official Action for U.S. Appl. No. 14/116,432, dated Feb. 1, 2016, 3 pages.
Official Action for U.S. Appl. No. 14/116,432, dated Jun. 24, 2016, 7 pages. Restriction Requirement.
Official Action for U.S. Appl. No. 14/116,432, dated Sep. 14, 2016, 18 pages.
Official Action for U.S. Appl. No. 14/116,432, dated Feb. 14, 2017, 16 pages.
Notice of Allowance for U.S. Appl. No. 14/116,432, dated Jun. 21, 2017, 7 pages.
Official Action for U.S. Appl. No. 15/711,607, dated Jun. 12, 2018, 9 pages.
Notice of Allowance for U.S. Appl. No. 15/711,607, dated Oct. 24, 2018, 5 pages.
Official Action for U.S. Appl. No. 17/675,902, dated Jun. 17, 2022, 18 pages.

\* cited by examiner

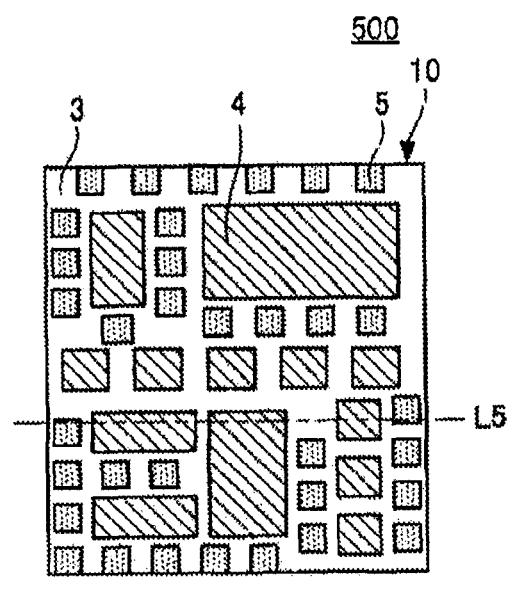
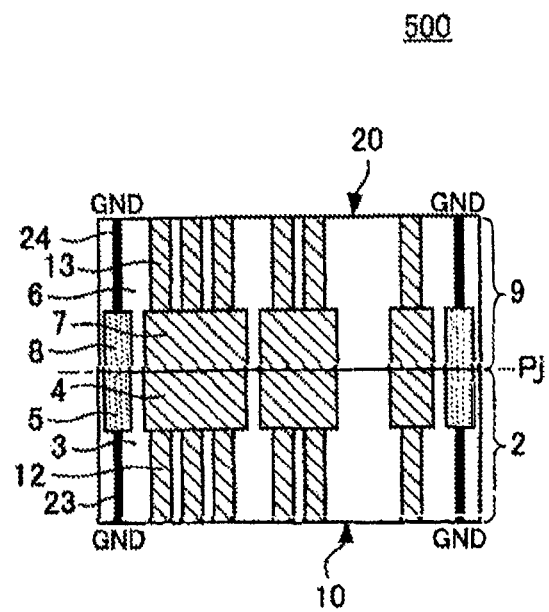
FIG.5 A    FIG.5 B

[ FIG. 6 ]
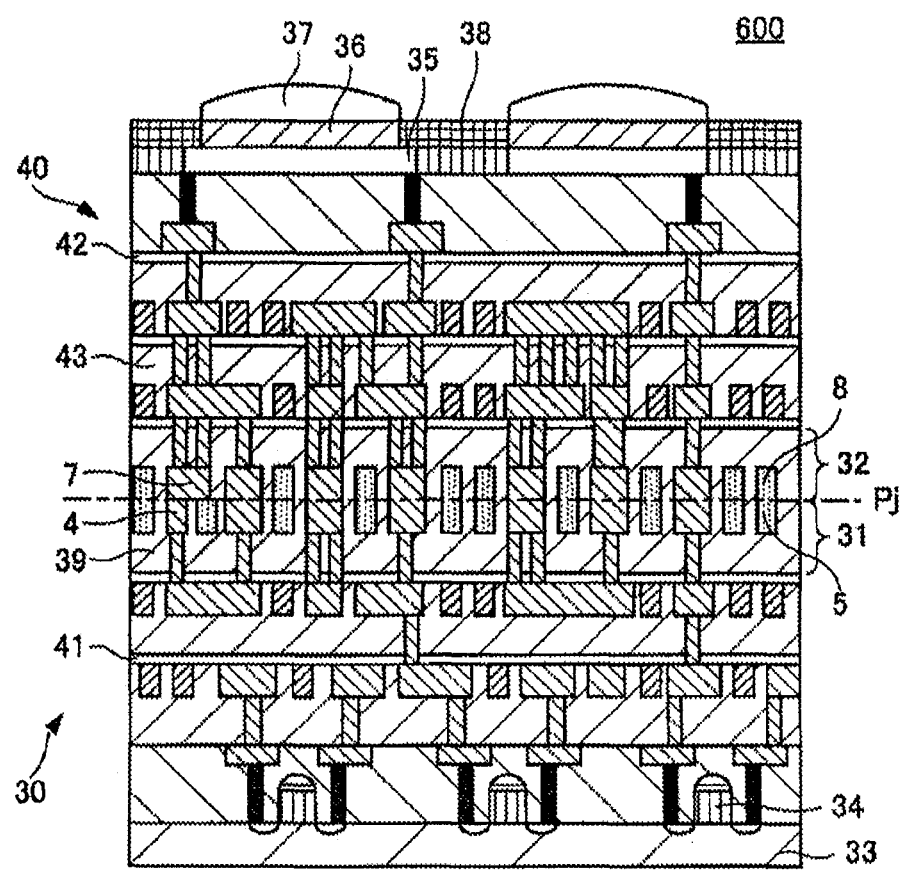

[FIG. 7]
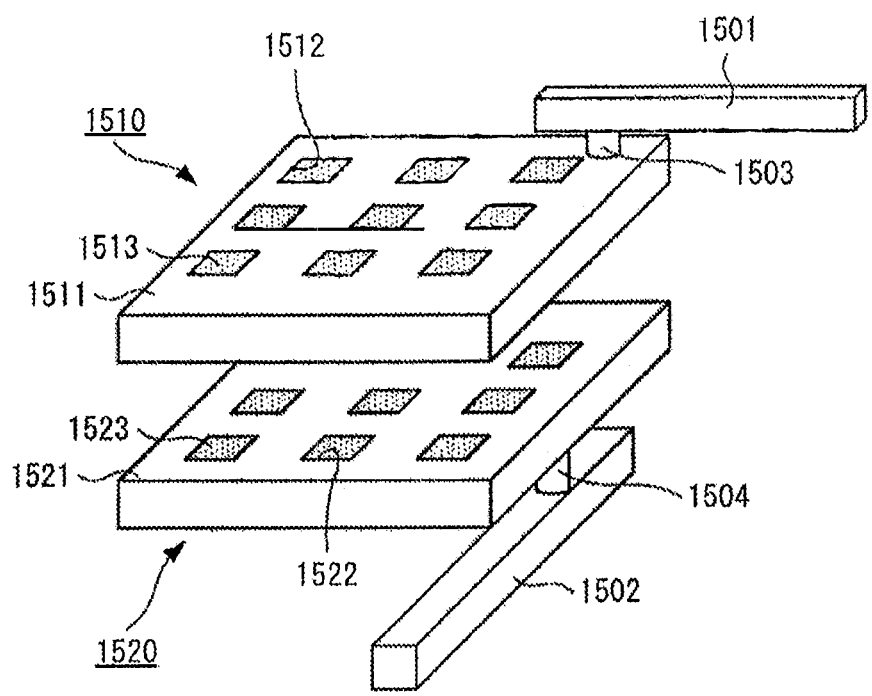
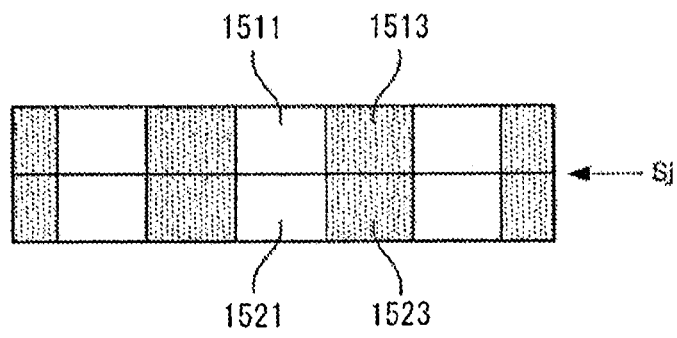
FIG. 8
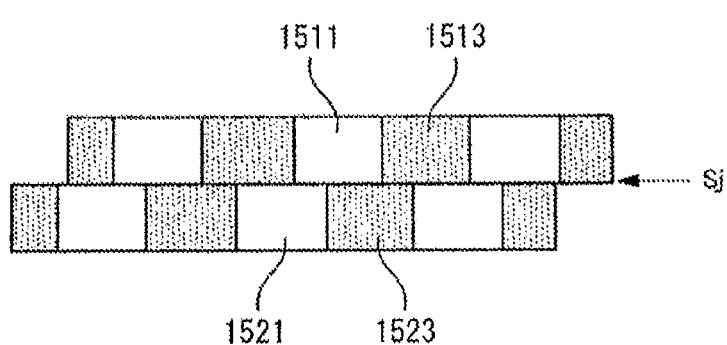

[ FIG. 9 ]
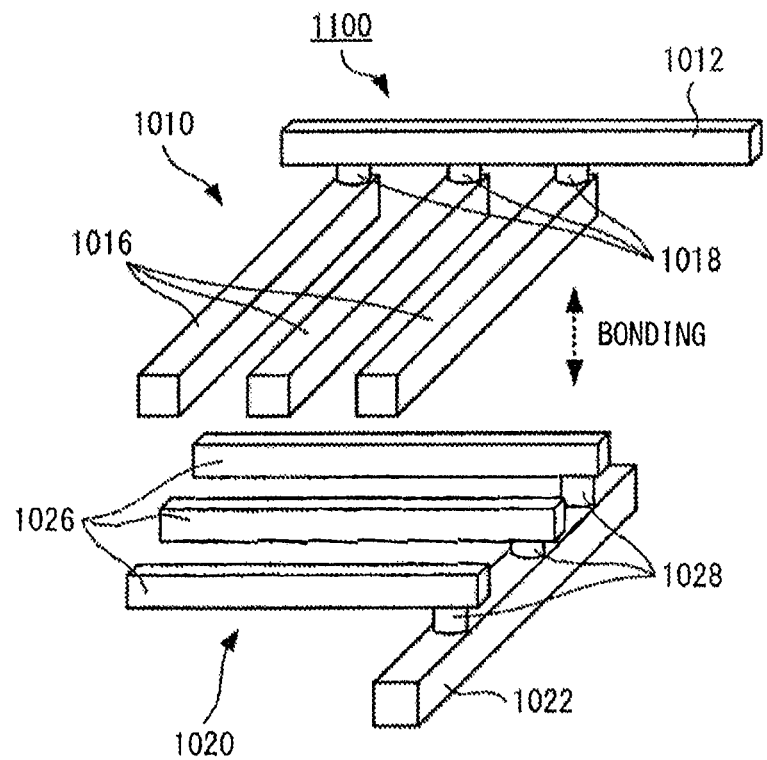
[ FIG. 10 ]
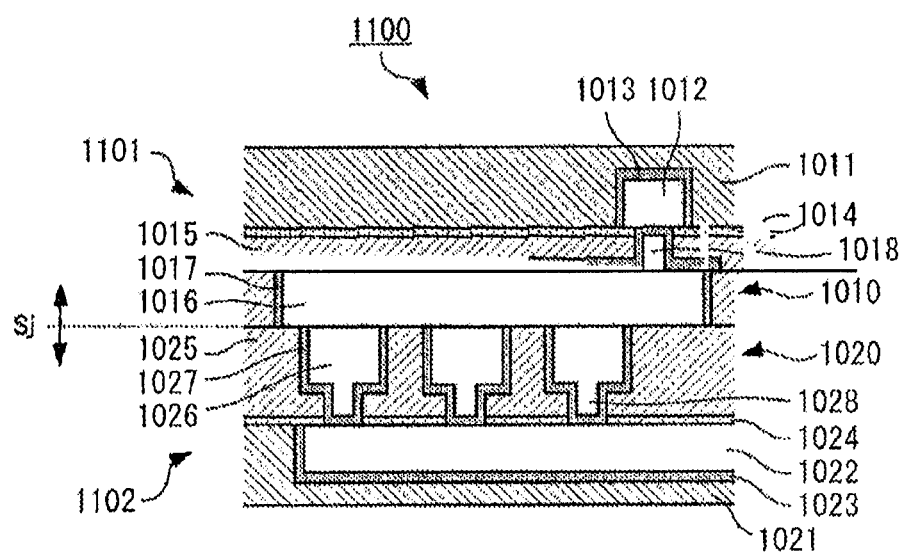

[FIG. 11]
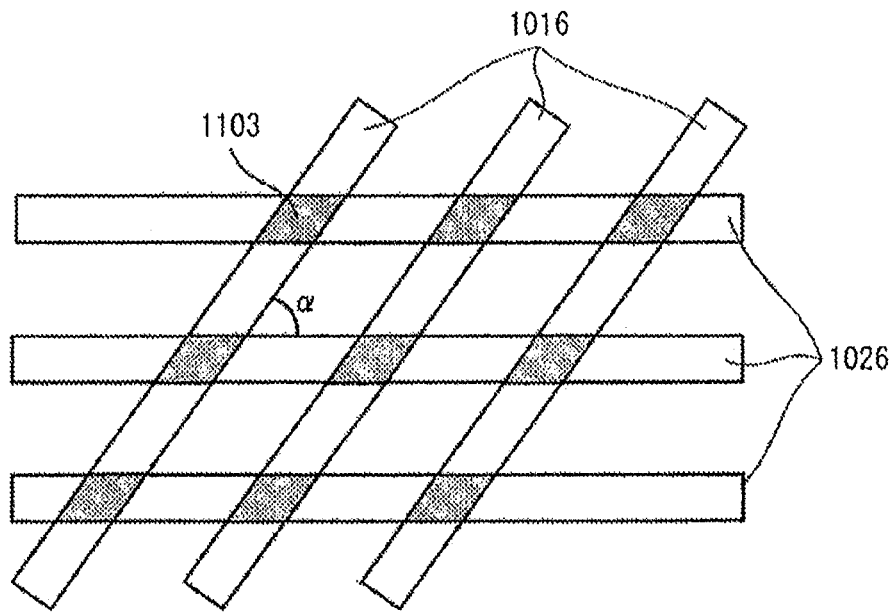
[FIG. 12]
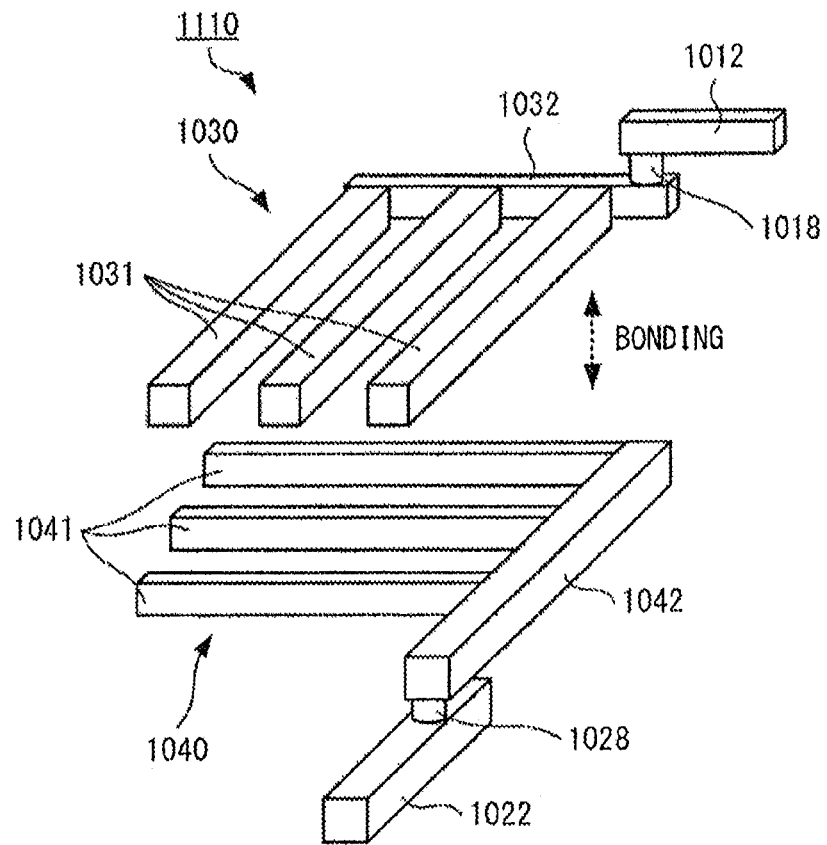

[ FIG. 13 ]
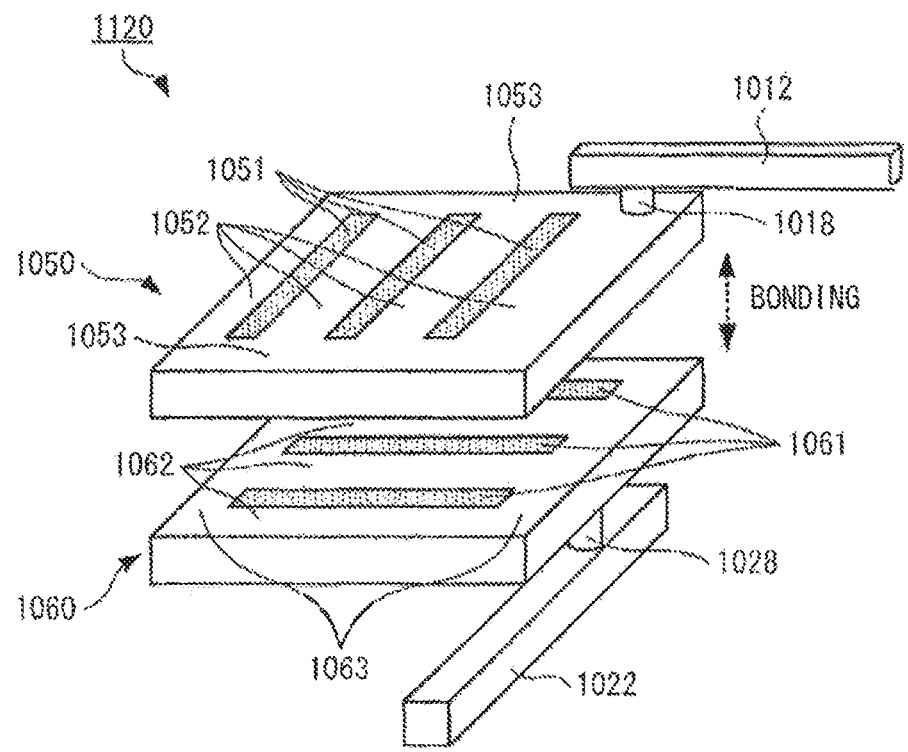
[ FIG. 14 ]
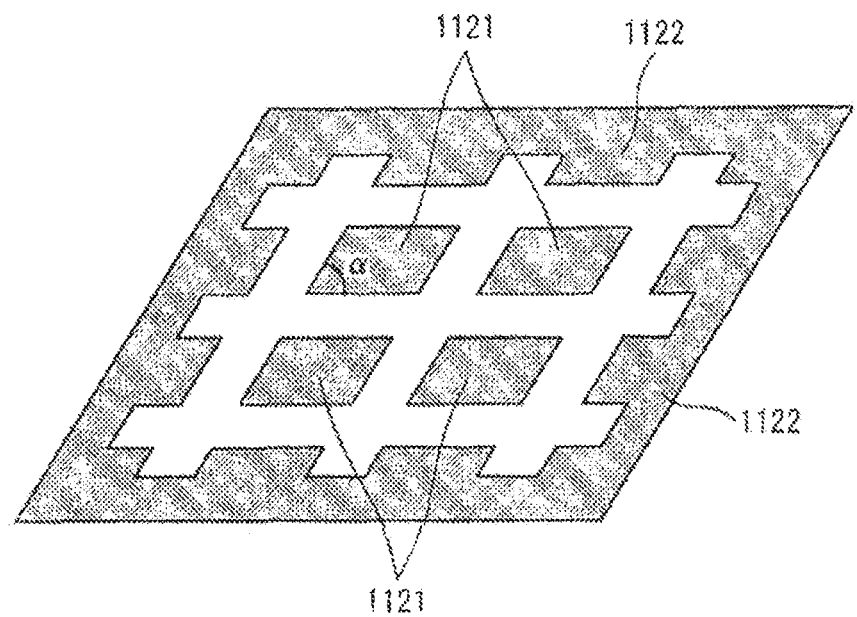

[ FIG. 15 ]
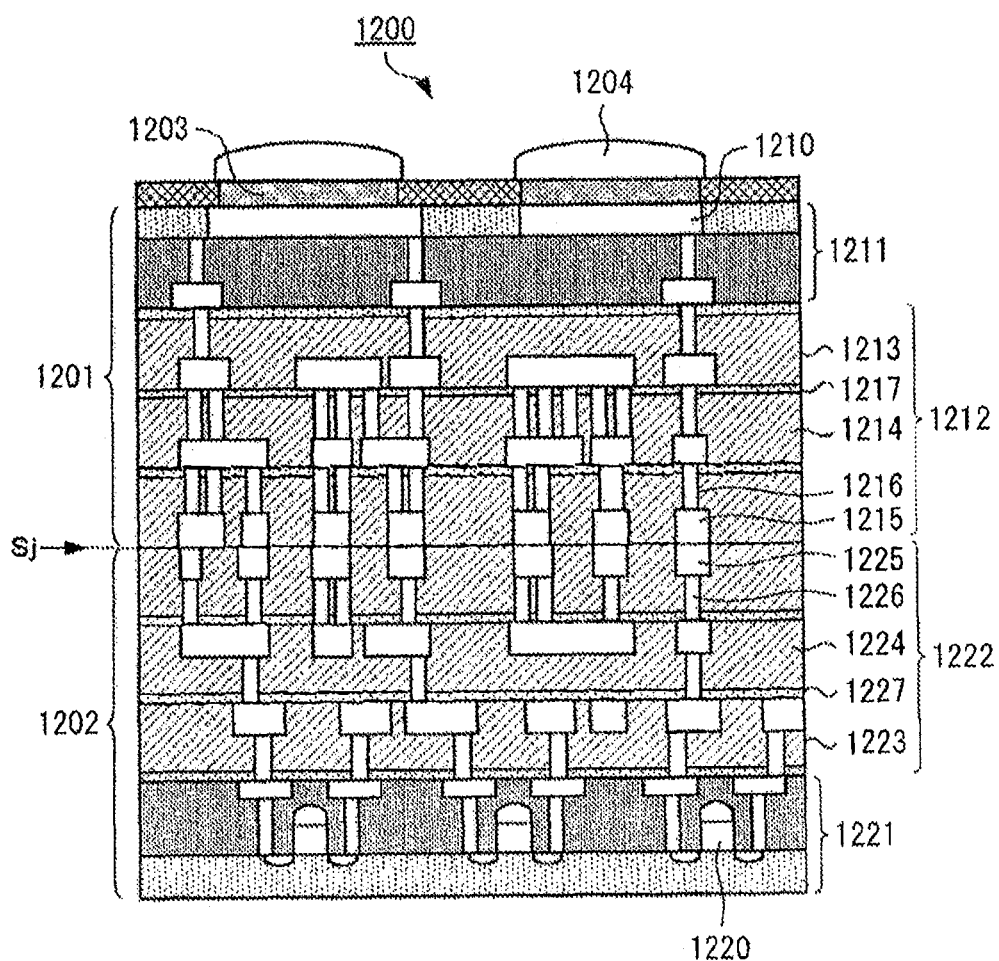

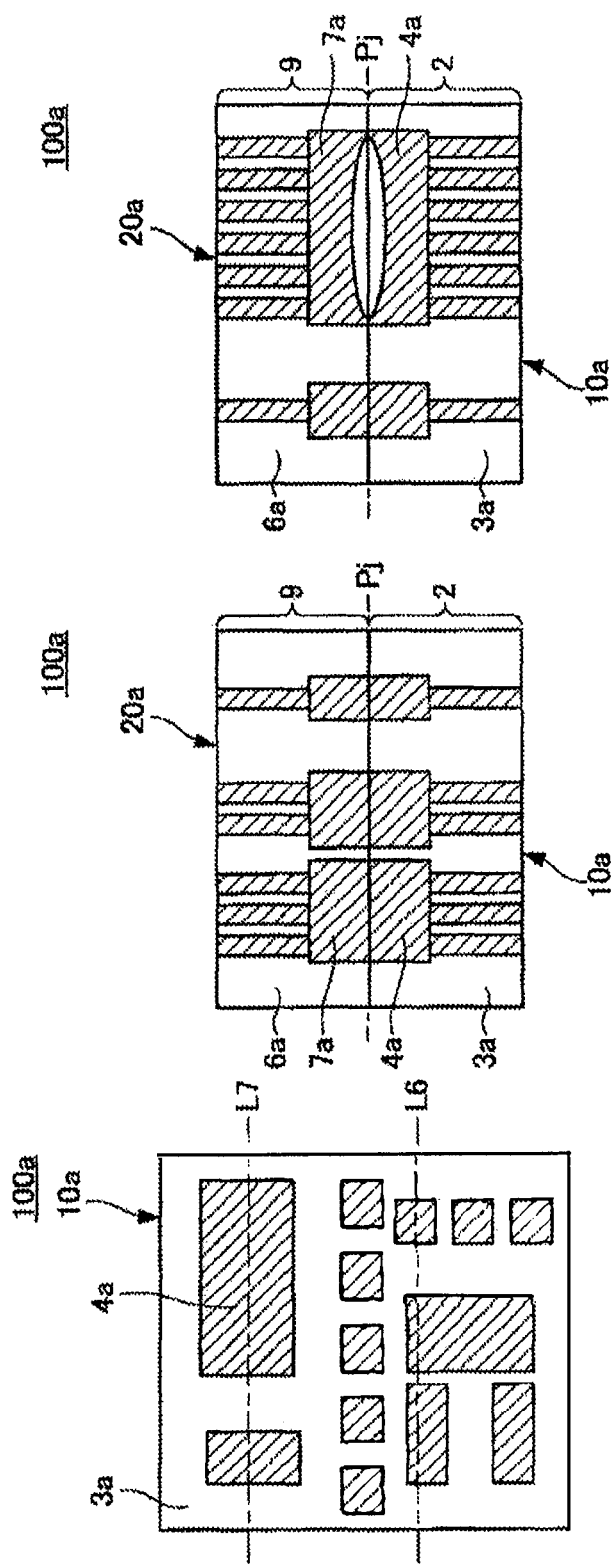

[ FIG. 17 ]
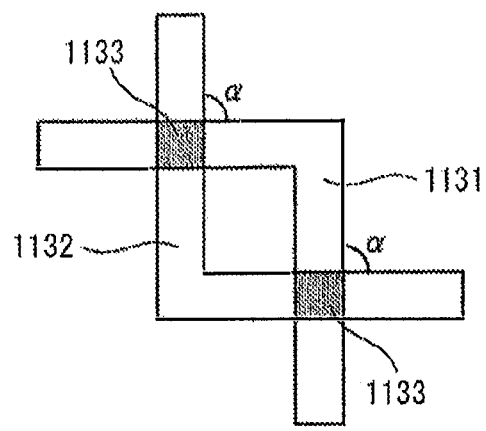
[ FIG. 18 ]
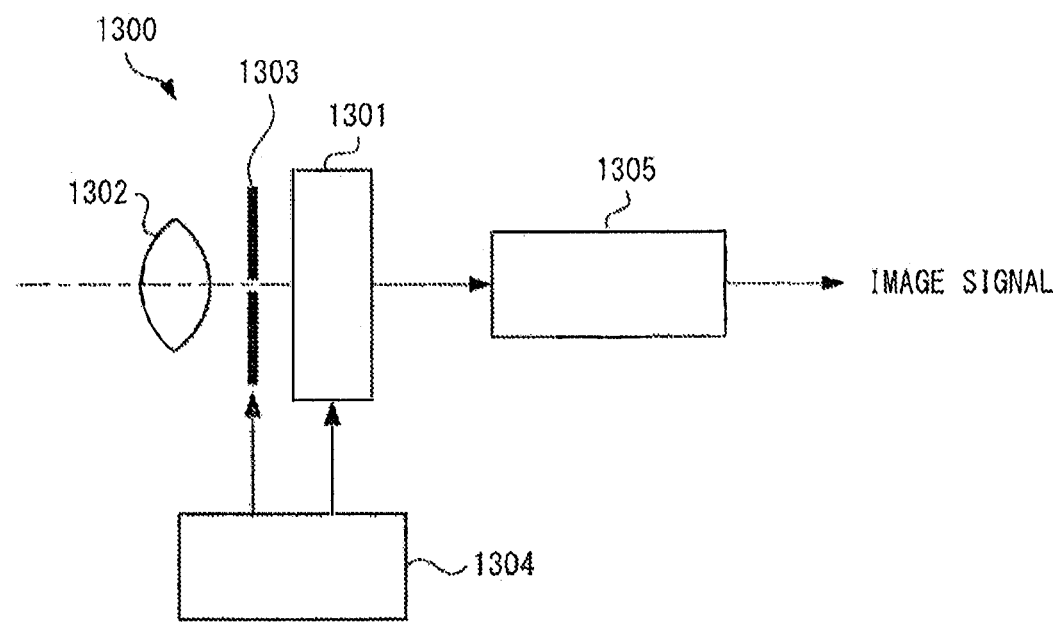

[ FIG. 19 ]
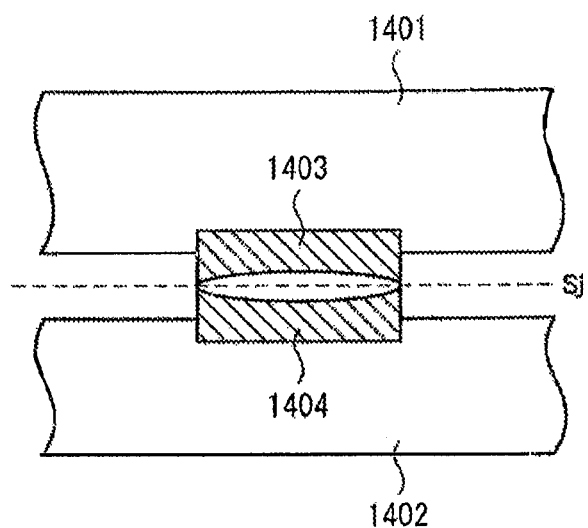
[ FIG. 20 ]
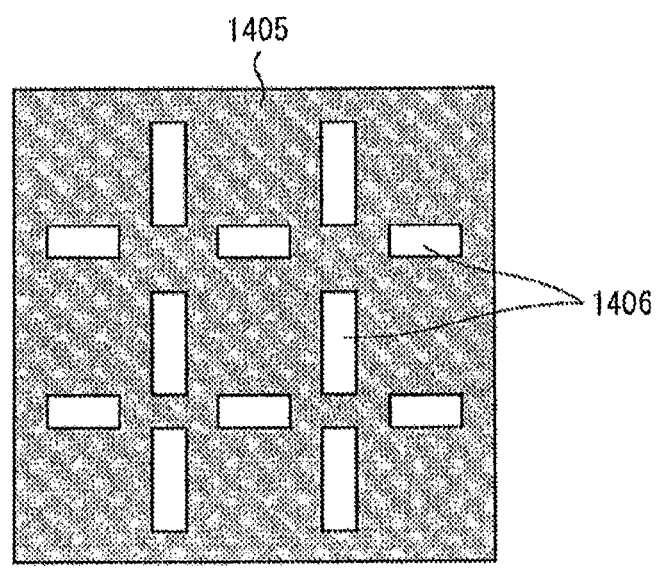

SEMICONDUCTOR DEVICE

CROSS REFERENCE TO RELATED APPLICATIONS

This application is a continuation of U.S. patent application Ser. No. 15/711,607, filed Sep. 21, 2017, which is a continuation of U.S. patent application Ser. No. 14/116,432, filed Nov. 8, 2013, now U.S. Pat. No. 9,799,587, which claims benefit of PCT Application No. PCT/JP2012/062484 having an international filing date of May 16, 2012, which designated the United States, which PCT application claimed the benefit of Japanese Patent Application Nos. 2011-115634, filed May 24, 2011, and 2011-129190, filed Jun. 9, 2011, the disclosures of which are incorporated herein by reference in their entirety.

TECHNICAL FIELD

The present technology relates to a semiconductor device in which two or more semiconductor members are bonded and laminated.

BACKGROUND ART

In related art, for example, in a case where a three-dimensional integrated circuit or the like is formed by bonding semiconductor members together, a method of directly bonding Cu electrodes disposed on bonding surfaces of the semiconductor members may be used (for example, refer to PTL 1, PTL 4, and PTL 5). For example, the following PTL 1 discloses bonding, through Cu electrodes (bonding pads), a first substrate in which a light reception element is formed and a second substrate in which a peripheral circuit is formed. In such a method, the Cu electrodes and interlayer insulating films that are included in the respective semiconductor members are planarized on a same plane and are bonded together, thereby bonding the facing Cu electrodes and the facing interlayer insulating films together.

However, in an electrical connection between the semiconductor members, it is difficult to make direct contact between the Cu electrodes included in the respective semiconductor members and to secure flatness of bonding surfaces to such an extent that the bonding surfaces are allowed to be bonded together. For example, in a case where the bonding surfaces of semiconductor members are planarized by a CMP (chemical mechanical polishing) method, in order to suppress occurrence of dishing of the bonding surfaces, it is necessary to strictly set up polishing conditions. Moreover, it is difficult to stably and continuously implement the set conditions.

Therefore, it has been proposed to allow the Cu electrodes to protrude from the interlayer insulating films by not perfectly planarizing the Cu electrodes and the interlayer insulating films and removing only parts of the interlayer insulating films by, for example, wet etching, dry etching, or the like (for example, refer to PTL 2 and NPL 1).

On the other hand, in typical semiconductor members not subjected to bonding, dishing is suppressed by providing a dummy pattern to have uniform wiring density (for example, refer to the following PTL 3). Moreover, in a case where bond strength between the semiconductor members bonded together in such a manner is measured, a so-called razor blade test as described in, for example, NPL 2 has been heretofore known.

Moreover, typically, when the Cu electrodes are bonded together, for example, Cu plates with a large area are bonded together to suppress misalignment, an increase in contact resistance, and the like. However, when each of the Cu plates is formed, typically, a CMP (Chemical Mechanical Polishing) process is performed on a bonding surface of the Cu plate. Therefore, when a Cu plate with a wide width (for example, 5 μm or over) is formed, dishing (depression) easily occurs on the bonding surface of the Cu plate by the CMP process.

Here, FIG. 19 illustrates a state around a bonding interface when Cu plates having dished bonding surfaces are bonded together. It is to be noted that FIG. 19 illustrates an example in which a Cu electrode of a first semiconductor chip 1401 and a Cu electrode of a second semiconductor chip 1402 are bonded together. In a case where dishing occurs on a bonding surface of a bonding pad 1403 of the first semiconductor chip 1401 and a bonding surface of a bonding pad 1404 of the second semiconductor chip 1402, when the bonding surfaces are bonded together, an air bubble or the like is generated at a bonding interface Sj. In this case, for example, a conduction failure or an increase in contact resistance may occur at the bonding interface Sj, and bondability may be considerably degraded accordingly.

To solve this issue, in PTL 5, there is proposed a technique of suppressing occurrence of dishing by forming a plurality of openings in a bonding pad.

FIG. 20 illustrates a schematic top view of a bonding pad proposed in PTL 5. A bonding pad 1405 proposed in PTL 5 is formed by dispersing a plurality of rectangular openings 1406 in a plate-like pad. It is to be noted that, although not illustrated in FIG. 20, insulating layers (dielectric layers) are formed in the openings 1406 of the bonding pad 1405. When the bonding pad 1405 has such a configuration, an electrode portion with a large area (a wide width) is not formed in the bonding pad 1405, and occurrence of dishing is allowed to be suppressed accordingly.

CITATION LIST

Patent Literature

[PTL 1] Japanese Unexamined Patent Application Publication No. 2006-191081
[PTL 2] Japanese Unexamined Patent Application Publication (Published Japanese Translation of PCT Application) No. 2006-522461
[PTL 3] Japanese Unexamined Patent Application Publication No. H11-265866
[PTL 4] Specification of Japanese Patent No. 3532788
[PTL 5] Japanese Unexamined Patent Application Publication No. 2010-103533

Non Patent Literature

[NPL 1] J. J. McMahon, J.-Q. Luand R. J. Gutmann, IEEE 55th ECTC, 2005
[NPL 2] W. P. Maszara, G. Goetz, A. Caviglia and J. B. McKitterick, J. Appl. Phys. 6 4(10)1988, pp. 4943

SUMMARY

Thus, various methods have been heretofore proposed to bond semiconductor members more firmly; however, a reliable method has not been found yet. Moreover, it is desirable to further suppress occurrence of, for example, a conduction failure, an increase in contact resistance, and the like at a bonding interface between Cu electrodes. Accordingly, a semiconductor device having a more reliable bonding surface is desired.

Therefore, it is desirable to provide a semiconductor device having a more reliable bonding surface.

A first semiconductor device according to an embodiment of the present technology includes: a first wiring layer including a first interlayer insulating film, a first electrode pad, and a first dummy electrode, the first electrode pad being embedded in the first interlayer insulating film and having one surface located on same plane as one surface of the first interlayer insulating film, and the first dummy electrode being embedded in the first interlayer insulating film, having one surface located on same plane as the one surface of the first interlayer insulating film, and being disposed around the first electrode pad; and a second wiring layer including a second interlayer insulating film, a second electrode pad, and a second dummy electrode, the second interlayer insulating film being located closer to the one surface of the first electrode pad of the first interlayer insulating film, the second electrode pad being embedded in the second interlayer insulating film, having one surface located on same surface as a surface located closer to the first interlayer insulating film of the second interlayer insulating film, and being bonded to the first electrode pad, and the second dummy electrode having one surface located on same plane as the surface located closer to the first interlayer insulating film of the second interlayer insulating film, being disposed around the second electrode pad, and being bonded to the first dummy electrode.

In the first semiconductor device according to the embodiment of the present technology, dummy electrodes are bonded together by disposing the dummy electrodes on a bonding surface between the first wiring layer and the second wiring layer. Accordingly, an area where metal bonding is performed is increased.

A second semiconductor device according to an embodiment of the present technology includes: a first semiconductor section including a first electrode, the first electrode being formed on a surface located closer to a bonding interface and extending in a first direction; and a second semiconductor section including a second electrode and disposed to be bonded to the first semiconductor section at the bonding interface, the second electrode being bonded to the first electrode at the bonding interface and extending in a second direction that intersects with the first direction.

In the second semiconductor device according to the embodiment of the present technology, the extending directions of the first electrode and the second electrode bonded together at the bonding interface intersect with each other, and a bonding region between the first electrode and the second electrode is formed in an intersection portion thereof. Accordingly, even if bonding misalignment occurs between the first electrode and the second electrode, an area of the bonding region between the first electrode and the second electrode formed in the intersection portion is not changed.

In the first semiconductor device according to the embodiment of the present technology, the area where metal bonding is performed is allowed to be increased in the bonding surface between the first wiring layer and the second wiring layer. Therefore, bond strength between the first wiring layer and the second wiring layer is allowed to be enhanced, and a semiconductor device having a more reliable bonding surface is obtainable.

In the second semiconductor device according to the embodiment of the present technology, for example, occurrence of a conduction failure, an increase in wiring resistance, and the like at the bonding interface between the first electrode and the second electrode is allowed to be further suppressed. Therefore, a semiconductor device having a more reliable bonding interface is obtainable.

BRIEF DESCRIPTION OF DRAWINGS

FIGS. 5A and 5B are diagrams illustrating a semiconductor device according to a fifth embodiment of the present technology.

FIG. 6 is a diagram illustrating a semiconductor image reception device according to a sixth embodiment of the present technology.

FIG. 7 is a diagram for describing an issue of bonding misalignment.

FIG. 8 is a diagram for describing the issue of bonding misalignment.

FIG. 9 is a schematic configuration diagram of each Cu bonding section of a semiconductor device according to a seventh embodiment of the present technology.

FIG. 10 is a schematic sectional view of a region around a bonding interface in the semiconductor device according to the seventh embodiment.

FIG. 11 is a schematic configuration diagram of a bonding region between Cu electrodes of the semiconductor device according to the seventh embodiment.

FIG. 12 is a schematic configuration diagram of each Cu bonding section of a semiconductor device according to an eighth embodiment of the present technology.

FIG. 13 is a schematic configuration diagram of each Cu bonding section of a semiconductor device according to a ninth embodiment of the present technology.

FIG. 14 is a schematic configuration diagram of a bonding region between Cu electrodes of the semiconductor device according to the ninth embodiment.

FIG. 15 is a schematic configuration sectional view of a semiconductor device (a solid-state image pickup device) according to a tenth embodiment of the present technology.

FIGS. 16A, 16B, and 16C are diagrams illustrating a semiconductor device according to a comparative example.

FIG. 17 is a schematic configuration diagram of a bonding region between Cu electrodes according to Modification Example 1.

FIG. 18 is a diagram illustrating an example of an electronic apparatus to which a semiconductor device (a solid-state image pickup device) of the present technology is applied.

FIG. 19 is a diagram for describing an influence of dishing on bonding between Cu electrodes in related art.

FIG. 20 is a schematic top view of a bonding pad in related art.

DESCRIPTION OF EMBODIMENTS

Some embodiments of the present technology will be described in detail below referring to the accompanying drawings.

First Embodiment

Figure 1:
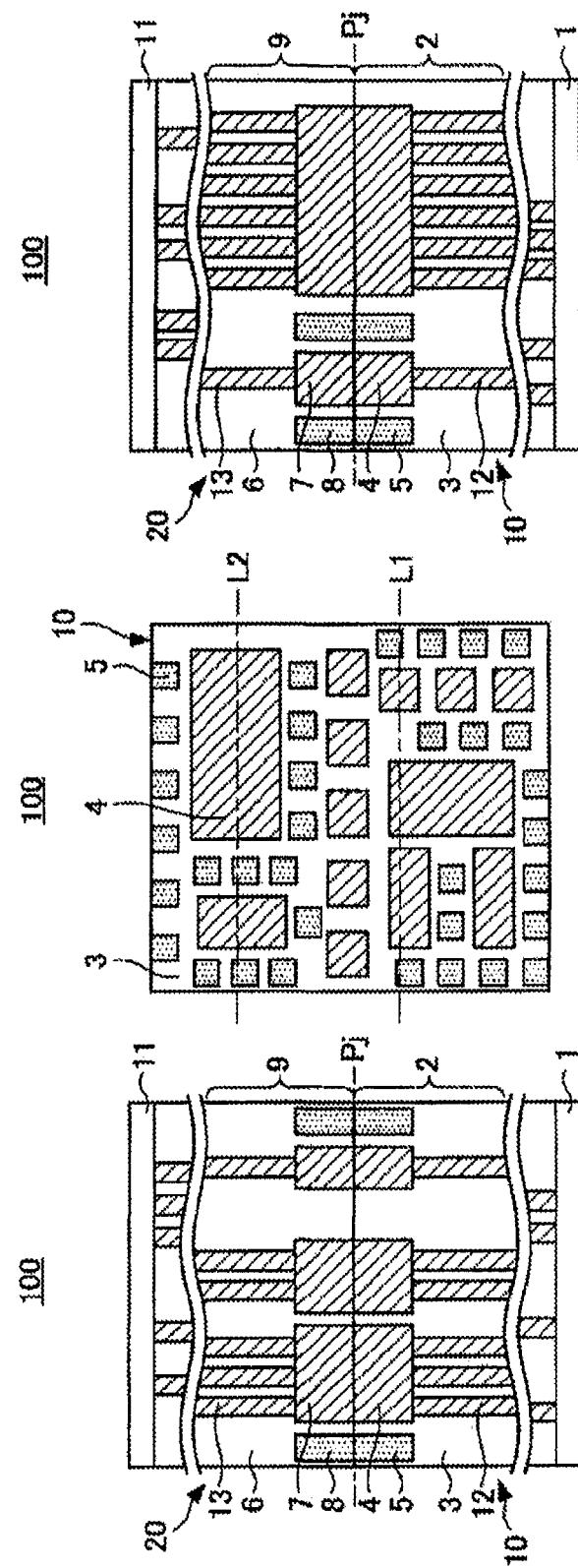
FIGS. 1A, 1B, and 1C are diagrams illustrating a semiconductor device according to a first embodiment of the present technology.

FIG. 1A is a schematic sectional view of a semiconductor device 100 according to a first embodiment. The semiconductor device 100 according to this embodiment includes a first semiconductor member 10 and a second semiconductor member 20 bonded to the first semiconductor member 10. Moreover, FIG. 1B is a diagram illustrating a bonding surface of the first semiconductor member 10, and FIG. 1A is a sectional view taken along a line L1 of FIG. 1B. Further, FIG. 1C is a sectional view taken along a line L2 of FIG. 1B.

As illustrated in FIGS. 1A and 1C, the first semiconductor member 10 includes, for example, a substrate 1 and a first wiring layer 2 formed on the substrate 1. Moreover, although not illustrated, for example, a semiconductor element such as a transistor or a diode is formed on the substrate 1. For example, a planarization film made of SiO2, NSG (non-doped silicate glass), PSG (phospho-silicate glass), or TEOS (tetraethoxysilane) is disposed on the semiconductor element, and the first wiring layer 2 is formed on the planarization film. Further, the first semiconductor member 10 may have a multilayer wiring configuration in which a plurality of wiring layers are laminated. However, in this case, among the wiring layers, the first wiring layer 2 is located closest to the second semiconductor member 20.

First electrode pads 4 made of, for example, Cu and dummy electrodes 5 made of, for example, Cu are disposed in the first wiring layer 2. Moreover, the first electrode pads 4 and the dummy electrodes 5 are embedded in an interlayer insulating film 3 made of, for example, a low dielectric constant material such as organic silica glass, SiO2, or the like. Respective surfaces located farther from the substrate 1 of the first electrode pads 4, the dummy electrodes 5, and the interlayer insulating film 3 are located in a same plane to form a bonding surface Pj between the first wiring layer 2 and a second wiring layer 9 which will be described later.

Moreover, a via 12 is connected to each of the first electrode pads 4, and each of the first electrode pads 4 is connected to a wiring line (not illustrated) through the via 12. The number of first electrode pads connected to one wiring line is determined to allow a total of resistance values of the pads 4 connected to the wiring line and the vias 12 to be equal to a resistance value necessary for wiring. An effect similar to that in a case where a pad with a large area is disposed is obtainable by connecting a plurality of first electrode pads 4 to one wiring line.

The second semiconductor member 20 includes, for example, a substrate 11 and a second wiring layer 9 formed on the substrate 11. Moreover, for example, a semiconductor element (not illustrated) such as a transistor or a diode may be formed on the substrate 11. The second semiconductor member 20 may have a multilayer wiring configuration in which a plurality of wiring layers are laminated; however, among the wiring layers, the second wiring layer 9 is located in a position (an uppermost layer) farthest from the substrate 11.

The second wiring layer 9 includes second electrode pads 7 made of, for example, Cu, dummy electrodes 8 made of, for example, Cu, and an interlayer insulating film 6. Moreover, the second electrode pads 7 and the dummy electrodes 8 are embedded in the interlayer insulating film 6. The interlayer insulating film 6 may be made of the same material as that of the interlayer insulating film 3. Respective surfaces located farther from the substrate 11 of the second electrode pads 7, the dummy electrodes 8, and the interlayer insulating film 6 are located in a same plane to form the bonding surface Pj between the first wiring layer 2 and the second wiring layer 9. Moreover, a via 13 is connected to each of the second electrode pads 7, and each of the second electrode pads 17 is connected to a wiring line (not illustrated) through the via 13.

Moreover, the first electrode pads 4 and the second electrode pads 7, and the dummy electrodes 5 and the dummy electrodes 8 are disposed plane-symmetrically with respect to the bonding surface Pj. The first electrode pads 4, the dummy electrodes 5, and the interlayer insulating film 3 are bonded to the second electrode pads 7, the dummy electrodes 8, and the interlayer insulating film 6 at the bonding surface Pj, respectively. Any of various techniques such as plasma bonding may be used for this bonding.

The first semiconductor member 10 and the second semiconductor member 20 are electrically connected to each other by bonding between the first electrode pads 4 and the second electrode pads 7. On the other hand, the dummy electrodes 5 and the dummy electrodes 8 do not electrically connect the first semiconductor member 10 and the second semiconductor member 20 to each other, and are disposed electrically independent of a periphery thereof.

Here, as illustrated in FIG. 1B, the dummy electrodes 5 (the dummy electrodes 8) are disposed between the first electrode pads 4 (the second electrode pads 7). A bonding area between metals is allowed to be increased by disposing the dummy electrodes 5 (the dummy electrodes 8) in such a manner and bonding the dummy electrodes 5 and the dummy electrodes 8 together. Therefore, bond strength between the first semiconductor member 10 and the second semiconductor member 20 are allowed to be enhanced.

In a case where dummy electrodes are not provided as with related art, for example, when the first semiconductor member 10 and the second semiconductor member 20 are out of alignment, a portion where an electrode pad made of Cu and an interlayer insulating film such as an SiO2 film are bonded together may exist. Strength of bonding between Cu and the SiO2 film is extremely weak, compared to bonding between Cu and Cu. Therefore, variations in bond strength in a bonding surface occur easily.

On the other hand, in the semiconductor device 100 according to this embodiment, since the dummy electrodes 5 (the dummy electrodes 8) are included to increase a bonding area between metals, high bond strength is allowed to be maintained in spite of slight misalignment. It is to be noted that an action of an increase in the bonding area between metals is not dependent on whether or not an arrangement pattern of the dummy electrodes 5 (the dummy electrodes 8) is, for example, uniform. Therefore, in a case where enhancement of bond strength is only a purpose, all dummy electrodes may not be bonded together and at least dummy electrodes having an area large enough to obtain target bond strength may be bonded together.

Moreover, metal wiring density in the bonding surface Pj is allowed to be uniform by disposing the dummy electrodes 5 (the dummy electrodes 8) between the first electrode pads 4 (the second electrode pads 7). Therefore, for example, when the bonding surface Pj is formed by a CMP method or the like, occurrence of dishing or erosion of the bonding surface Pj is allowed to be suppressed. This effect is not dependent on the arrangement pattern of the dummy electrodes 5 (the dummy electrodes 8) as well, and as long as area density of the dummy electrodes 5 satisfies a predetermined value at which dishing or erosion does not occur under predetermined CMP conditions, the arrangement pattern may be appropriately modified.

Further, the dummy electrodes 5 (the dummy electrodes 8) may be disposed, for example, only around the first electrode pads 4 (the second electrode pads 7) susceptible to dishing. In other words, the dummy electrodes 5 (the dummy electrodes 8) of which area density satisfies a predetermined value may be disposed only in a position where suppression of dishing, erosion, and the like is desired.

Second Embodiment

In the first embodiment, the first electrode pads 4 and the second electrode pads 7, and the dummy electrode 5 and the dummy electrode 8 are disposed plane-symmetrically with respect to the bonding surface Pj. However, as described above, they are not necessarily disposed plane-symmetrically.

Figure 2:
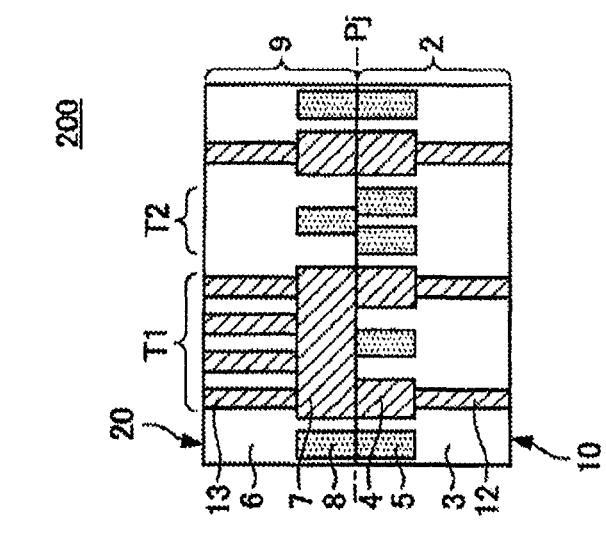
FIGS. 2A, 2B, and 2C are diagrams illustrating a semiconductor device according to a second embodiment of the present technology.
Figure 2:
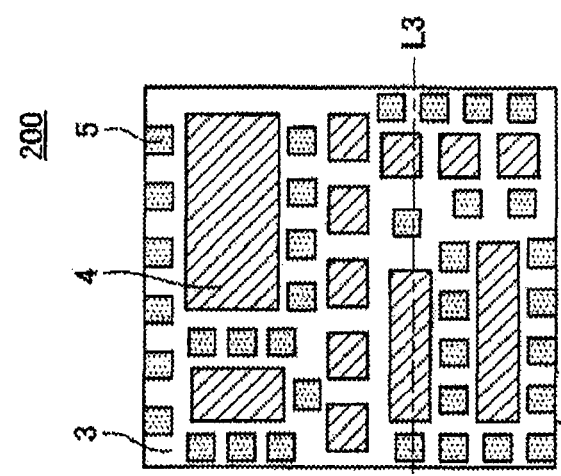
Figure 2:
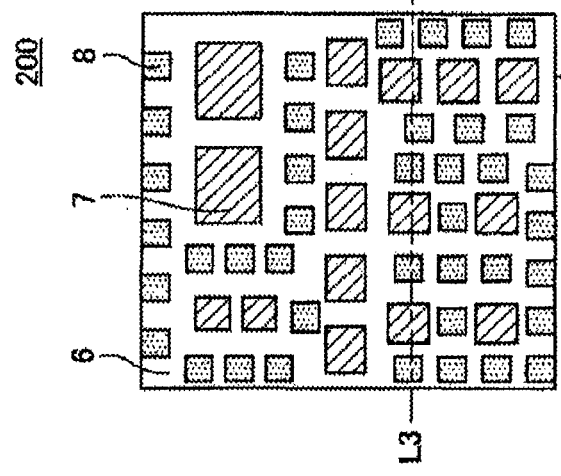

FIG. 2A is a diagram illustrating a bonding surface of the first semiconductor member 10 of a semiconductor device 200 according to a second embodiment and FIG. 2B is a diagram illustrating a bonding surface of the second semiconductor member 20. Moreover, FIG. 2C is a sectional view of the semiconductor device 200 taken along a line L3 illustrated in FIGS. 2A and 2B. It is to be noted that like components are denoted by like numerals as of the first embodiment, and will not be further described. Moreover, in this embodiment, configurations other than the first wiring layer 2 and the second wiring layer 9 are the same as those in the first embodiment (refer to FIG. 1C); therefore, in FIG. 2C, only the first wiring layer 2 and the second wiring layer 9 are illustrated.

The semiconductor device 200 according to this embodiment includes the first semiconductor member 10 and the second semiconductor member 20 bonded to the first semiconductor member 10. The first semiconductor member 10 includes the first wiring layer 2, and the second semiconductor member 20 includes the second wiring layer 9. In the first wiring layer 2 and the second wiring layer 9, arrangement patterns of the first electrode pads 4, the second electrode pads 7, the dummy electrodes 5, and the dummy electrodes 8 are different from those in the first embodiment.

For example, in a region T1 in FIG. 2C, two first electrode pads 4 and one dummy electrode 5 are bonded to one second electrode pad 7. Moreover, in a region T2, two dummy electrodes 5 are bonded to one dummy electrode 8. Thus, in this embodiment, the first electrode pads 4 and the second electrode pads 7, and the dummy electrodes 5 and the dummy electrodes 8 are not disposed plane-symmetrically with respect to the bonding surface Pj. However, since a plurality of dummy electrodes 5 are bonded to the second electrode pad 7 and the dummy electrode 8, bond strength is allowed to be enhanced as with the first embodiment.

Moreover, also in this embodiment, since the dummy electrodes 5 (the dummy electrodes 8) are disposed between the first electrode pads 4 (the second electrode pads 7), metal wiring density in the bonding surface Pj is allowed to be uniform, and dishing, erosion, and the like caused when the bonding surface Pj is formed by a CMP method is allowed to be suppressed. Further, functions and effects by other configurations are also similar to those in the first embodiment.

Third Embodiment

Figure 3:
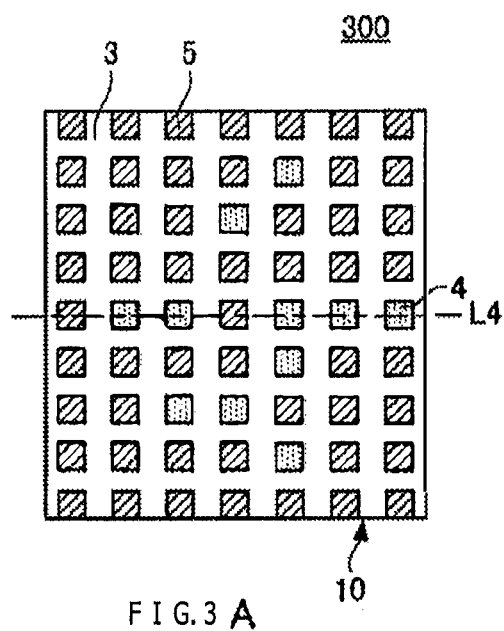
FIGS. 3A and 3B are diagrams illustrating a semiconductor device according to a third embodiment of the present technology.
Figure 3:
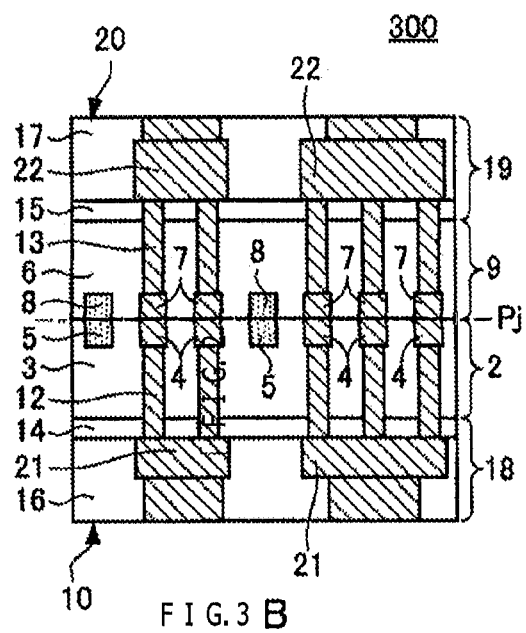

FIG. 3A is a diagram illustrating a bonding surface of the first semiconductor member 10 of a semiconductor device 300 according to a third embodiment, and FIG. 3B is a sectional view of the semiconductor device 300 taken along a line L4 illustrated in FIG. 3A. Moreover, in this embodiment, configurations other than the first wiring layer 2, the second wiring layer 9, a third wiring layer 18, and a fourth wiring layer 19 are the same as those in the first embodiment (refer to FIG. 1C); therefore, only these wiring layers are illustrated in FIG. 3B.

The semiconductor device 300 according to this embodiment includes the first semiconductor member 10 and the second semiconductor member 20. The first semiconductor member 10 includes the first wiring layer 2 and the third wiring layer 18. As illustrated in FIG. 3A, in this embodiment, the first electrode pads 4 and the dummy electrodes 5 in the first wiring layer 2 have the same bonding surface shape, and are all arranged at equal intervals.

Moreover, as illustrated in FIG. 3B, the first electrode pads 4 are connected to wiring lines 21 in the third wiring layer 18 through the vias 12. It is to be noted that, for example, a diffusion prevention film 14 made of SiN or the like is formed between the first wiring layer 2 and the third wiring layer 18.

The second semiconductor member 20 includes the second wiring layer 9 and the fourth wiring layer 19. The second electrode pads 7 and the dummy electrodes 8 in the second wiring layer 9 are disposed plane-symmetrically to the first electrode pads 4 and the dummy electrodes 5, respectively, with respect to the bonding surface Pj. The second electrode pads 7 are connected to wiring lines 22 in the fourth wiring layer 19 through vias 13. Moreover, for example, a diffusion prevention film 15 made of SiN or the like is disposed between the second wiring layer 9 and the fourth wiring layer 19.

Also in this embodiment, the dummy electrodes 5 and 8 are provided, and are bonded together in such a manner; therefore, bond strength between the first semiconductor member 10 and the second semiconductor member 20 is allowed to be enhanced. In particular, in this embodiment, the first electrode pads 4 (the second electrode pads 3) and the dummy electrodes 5 (the dummy electrodes 8) have the same bonding surface shape, and are all arranged at equal intervals; therefore, area density of wiring lines (the electrode pads and the dummy electrodes) is allowed to be more uniform. Accordingly, dishing, erosion, and the like caused when the bonding surface is formed by polishing is allowed to be suppressed; therefore, the bonding surface is allowed to be more planarized. Thus, generation of voids in the bonding surface Pj when the first semiconductor member 10 and the second semiconductor member 20 are bonded together is preventable.

Moreover, in this embodiment, even though layouts of the wiring lines 21 and 22 are different from each other, layouts of the first electrode pads 4 (the second electrode pads 7) and the dummy electrodes 5 (the dummy electrodes 8) are allowed to used in common without changing the layouts. In this case, the first electrode pads 4, the second electrode pads 7, the dummy electrodes 5, and the dummy electrodes 8 may be configured of, for example, the same Cu electrodes. In other words, some Cu electrodes are selected from Cu electrodes all arranged at equal intervals to be used as the first electrode pads 4 or the second electrode pads 7, and the vias 12 or the vias 13 are connected to the selected Cu electrodes. Then, conduction is easily obtainable by using other Cu electrodes as dummy electrodes without changing layouts of Cu electrodes in the first wiring layer 2 and the second wiring layer 9 for arbitrary patterns of the wiring lines 21 and 22. Therefore, since it is not necessary to change the layouts of electrodes bonded together every time wiring patterns are changed, design cost is allowed to be reduced. Further, functions and effects by other configurations are also similar to those in the first embodiment.

Fourth Embodiment

Figure 4:
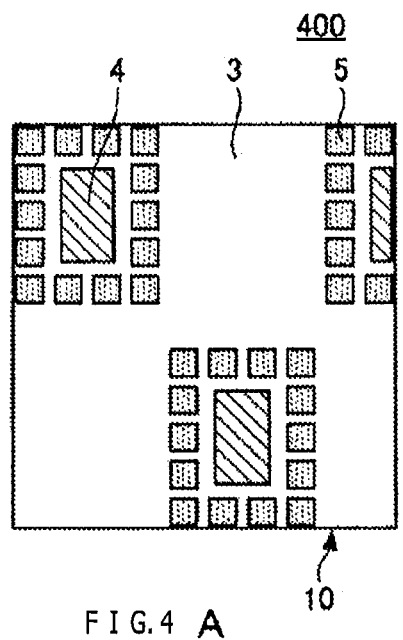
FIGS. 4A and 4B are diagrams illustrating a semiconductor device according to a fourth embodiment of the present technology.
Figure 4:
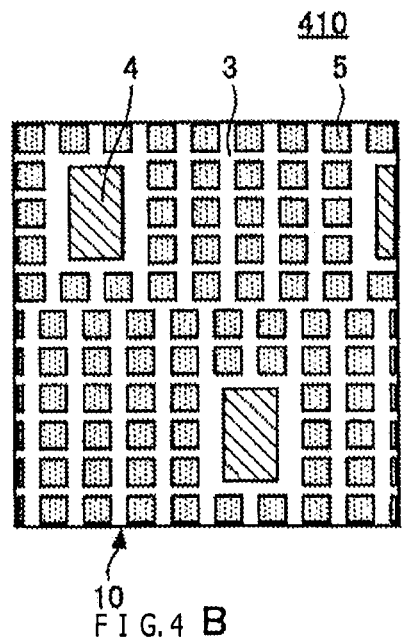

FIG. 4A is a diagram illustrating a bonding surface of the first semiconductor member 10 configuring a semiconductor device 400 according to a fourth embodiment. It is to be noted that like components are denoted by like numerals as of the first embodiment, and will not be further described. Moreover, in this embodiment, only the layouts of the first electrode pads 4 (the second electrode pads 7) and the dummy electrodes 5 (the dummy electrodes 8) are different from those in the first embodiment, and other configurations are not illustrated in FIG. 4A.

As illustrated in FIG. 4A, in the first semiconductor member 10 in this embodiment, the dummy electrodes 5 are arranged only around the first electrode pads 4. Since the dummy electrodes 5 are arranged in such a manner, after polishing the bonding surface by, for example, a CMP method or the like, peripheral regions where the first electrode pads 4 and the dummy electrodes 5 are disposed are allowed to secure substantially uniform flatness. Moreover, in the second semiconductor member 20 (not illustrated), the second electrode pads 7 and the dummy electrodes 8 are disposed plane-symmetrically to the first electrode pads 4 and the dummy electrodes 5, respectively, with respect to the bonding surface. Therefore, peripheral regions where the second electrode pads 7 and the dummy electrodes 8 are disposed are allowed to secure substantially uniform flatness in a similar manner. Thus, also in this embodiment, the second electrode pads 7 and the dummy electrodes 8 are allowed to be bonded to the first electrode pads 4 and the dummy electrodes 5, respectively, without generating voids.

It is to be noted that, as with a semiconductor device 410 illustrated in FIG. 4B, the dummy electrodes 5 may be arranged in not regions around the first electrode pads 4 but all regions other than the first electrode pads 4. Although only the first semiconductor member 10 is illustrated in FIG. 4B, the second electrode pads 7 and the dummy electrodes 8 in the second semiconductor member are disposed plane-symmetrically to the first electrode pads 4 and the dummy electrodes 5 in the first semiconductor member 10, respectively. In this case, the dummy electrodes 5 are not necessarily arranged at, for example, equal intervals. For example, when the first semiconductor member 10 and the second semiconductor member 20 are bonded together, an effect of enhancing bond strength is obtainable with a layout of wiring density obtained when one or more pairs selected from a plurality of dummy electrodes 5 and a plurality of dummy electrodes 8 are bonded together.

Fifth Embodiment

FIG. 5A is a diagram illustrating a bonding surface of the first semiconductor member 10 configuring a semiconductor device 500 according to a fifth embodiment. Moreover, FIG. 5B is a sectional view of the semiconductor device 500 taken along a line L5 of FIG. 5A. It is to be noted that like components are denoted by like numerals as of the second embodiment, and will not be further described. Further, this embodiment is different from the second embodiment only in that vias 23 and 24 are provided. Therefore, configurations other than the first wiring layer 2 and the second wiring layer 9 are not illustrated in FIG. 5B.

In the semiconductor device 500 according to this embodiment, the vias 23 are connected to the dummy electrodes 5 of the first semiconductor member 10. Moreover, the vias 23 are connected to a ground. Further, the vias 24 are connected to the dummy electrodes 8 of the second semiconductor member 20, and the vias 24 are connected to a ground.

Ground levels of the first semiconductor member 10 and the second semiconductor member 20 are allowed to be equal to each other by connecting all of the dummy electrodes 5 and 8 to the ground in such a manner. Moreover, in a case where the dummy electrodes 5 and 8 are connected to a power supply voltage, a power supply may be used in common. Further, functions and effects by other configurations are also similar to those in the second embodiment.

Sixth Embodiment

Here, as a more specific example of a semiconductor device according to the present technology, a semiconductor image reception device will be described. FIG. 6 is a diagram illustrating a configuration of a semiconductor image reception device 600 according to a sixth embodiment. It is to be noted that like components are denoted by like numerals as of the second embodiment (refer to FIG. 2C), and will not be further described.

The semiconductor image reception device 600 according to this embodiment includes a first semiconductor member 30 and a second semiconductor member 40 bonded to the first semiconductor member 30. The first semiconductor member 30 includes, for example, a Si substrate 33 and transistors 34 formed of a complementary metal-oxide film semiconductor on the Si substrate 33. Moreover, a plurality of wiring layers are laminated on the transistors 34, and a first wiring layer 31 is formed in a position (an uppermost layer) farthest from the substrate 33. Further, diffusion prevention films 41 made of, for example, SiCN, SiN, or the like are disposed between the wiring layers.

In the first wiring layer 31, the first electrode pads 4 made of, for example, Cu and the dummy electrodes 5 made of, for example, Cu are disposed. Moreover, the first electrode pads 4 and the dummy electrodes 5 are embedded in an interlayer insulating film 39 made of, for example, a low dielectric constant material such as organic silica glass, SiO2, or the like, and respective surfaces located farther from the Si substrate 33 of the first electrode pads 4, the dummy electrodes 5, and the interlayer insulating film 39 are located in a same plane. Further, the first electrode pads 4 are connected to wiring lines in a wiring layer located closer to the Si substrate 33 through vias.

On the other hand, the second semiconductor member 40 includes photoelectric conversion layers 35 outputting an electrical signal (a charge) corresponding to an amount of received light, color filters 36 disposed on the photoelectric conversion layers 35, and microlenses 37 disposed on the color filters 36. Moreover, on the photoelectric conversion layers 35, an insulating film 38 is formed in a region other than the color filters 36. One pixel is formed corresponding to one combination of one photoelectric conversion layer 35, one color filter 36, and one microlens 37.

Wiring layers are laminated on surfaces located farther from the color filters 36 of the photoelectric conversion layers 35, and a second wiring layer 32 is formed in a position farthest from the photoelectric conversion layer 35. It is to be noted that diffusion prevention films 42 made of, for example, SiCN or SiN are formed between the wiring layers. Moreover, the second wiring layer 32 is configured of an interlayer insulating film 43 made of a low dielectric constant material such as organic silica glass, SiO2, or the like, the second electrode pads 7, and the dummy electrodes 8. The second electrode pads 7 and the dummy electrodes 8 are embedded in the interlayer insulating film 43, and respective surfaces located farther from the photoelectric conversion layers 35 of the second electrode pads 7, the dummy electrodes 8, and the interlayer insulating film 43 are located in a same plane. As layouts of the first electrode pads 4, the dummy electrodes 5, the second electrode pads 7, and the dummy electrodes 8, any of the layouts illustrated in the first to fifth embodiments may be adopted.

The photoelectric conversion layers 35 may be configured of, for example, photodiodes or the like. Moreover, the transistors 34 included in the second semiconductor member are so-called transfer transistors, reset transistors, amplification transistors, and the like, and computes a charge output from the photoelectric conversion layers 35.

Moreover, although not illustrated, the semiconductor image reception device 600 further includes, for example, circuits such as a vertical drive circuit, a column signal processing circuit, and a horizontal drive circuit. The vertical drive circuit selectively scans respective pixels from one row to another in a vertical direction, and supplies a pixel signal based on a charge generated in the photoelectric conversion layer 35 to the column signal processing circuit. Further, the column signal processing circuit is disposed for, for example, each column of pixels, and performs, in each pixel column, signal processing such as noise removal on signals output from pixels in one row. In addition, the horizontal drive circuit sequentially selects the column signal processing circuits by sequentially outputting horizontal scanning pulses, and allows each of the column signal processing circuits to output a pixel signal to a horizontal signal line.

Also in the semiconductor image reception device 600 according to this embodiment, the first semiconductor member 30 and the second semiconductor member 40 are bonded together by the dummy electrodes 5 and 8; therefore, bond strength is allowed to be enhanced. Moreover, the layouts of the first electrode pads 4, the dummy electrodes 5, the second electrode pads 7, and the dummy electrodes 8 are similar to any of those in the first to fifth embodiments; therefore, the bonding surface Pj is allowed to be formed in a more uniform flat surface. Accordingly, dishing and erosion are allowed to be suppressed; therefore, generation of voids in the bonding surface Pj is preventable. Further, functions and effects by other configurations are also similar to those in the first to fifth embodiments.

Seventh Embodiment

First, an issue of bonding misalignment which may be caused in a case where a bonding pad proposed in the above-described PTL 5 is used will be briefly described referring to FIG. 7 and FIGS. 8(a) and (b). It is to be noted that FIG. 7 is a schematic perspective view of a Cu bonding section including a bonding pad with a configuration similar to the bonding pad proposed in the above-described PTL 5. Moreover, FIG. 8(a) is a schematic sectional view of a region around the bonding interface Sj in a case where bonding misalignment does not occur, and FIG. 8(b) is a schematic sectional view of a region around the bonding interface Sj in a case where bonding misalignment occurs.

A first Cu bonding section 1510 includes a first bonding pad 1511 in which a plurality of openings 1512 are formed. On the other hand, a second Cu bonding section 1520 includes a second bonding pad 1521 in which a plurality of openings 1522 are formed. It is to be noted that the first Cu bonding section 1510 and the second Cu bonding section 1520 herein have the same configuration, and the bonding pads thereof have an equal size, and the openings thereof have an equal size.

Moreover, the first Cu bonding section 1510 is electrically connected to a first Cu wiring line 1501 through a via 1503, and the second Cu bonding section 1520 is electrically connected to a second Cu wiring line 1502 through a via 1504. It is to be noted that insulating films 1513 and insulating films 1523 are formed in the openings 1512 of the first bonding pad 1511 and the opening 1522 of the second bonding pad 1521, respectively.

In a case where bonding misalignment between the first Cu bonding section 1510 and the second Cu bonding section 1520 in the configuration illustrated in FIG. 7 does not occur, as illustrated in FIG. 8(a), a contact area between the first bonding pad 1511 and the second bonding pad 1521 is maximized, and contact resistance at the bonding interface Sj is minimized. On the other hand, in a case where bonding misalignment occurs, as illustrated in FIG. 8(b), the contact area between the first bonding pad 1511 and the second bonding pad 1521 is reduced (a contact area between the bonding pad and the insulating film is increased), and contact resistance at the contact interface Sj is increased.

In other words, a configuration example illustrated in FIG. 7 is capable of solving the above-described issue of dishing; however, when bonding misalignment occurs, contact resistance at the bonding interface Sj may considerably vary. Moreover, when bonding misalignment is large, a conduction failure may occur at the bonding interface Sj. Therefore, in this embodiment, there will be described a configuration example in which, even if bonding misalignment between two Cu bonding sections occurs in a semiconductor device including Cu bonding sections in which an insulating film is disposed between electrode sections, occurrence of variations in contact resistance, a conduction failure, and the like are allowed to be suppressed.

(Configuration of Semiconductor Device)

FIGS. 9 and 10 illustrate a schematic configuration of a semiconductor device according to a seventh embodiment. FIG. 9 is a schematic perspective view of each Cu bonding section in the semiconductor device according to this embodiment. Moreover, FIG. 10 is a schematic sectional view of a region around the bonding interface Sj in the semiconductor device according to this embodiment. It is to be noted that, for simplification of description, in FIGS. 9 and 10, only a schematic configuration around one bonding region between Cu electrodes is illustrated. Further, in FIG. 9, for simplification of description, only an electrode section is illustrated, and configuration sections arranged around the electrode section such as a Cu barrier layer and an interlayer insulating film are not illustrated. In addition, in FIG. 9, to more clearly illustrate the configuration of each Cu bonding section, respective Cu bonding sections are separately illustrated.

As illustrated in FIG. 10, a semiconductor device 1100 includes a first wiring section 1101 (a first semiconductor section) and a second wiring section 1102 (a second semiconductor section). Then, in this embodiment, a surface located closer to a first interlayer insulating film 1015 which will be described later of the first wiring section 1101 and a surface located closer to a second interlayer insulating film 1025 which will be described later of the second wiring section 1102 are bonded together to form the semiconductor device 1100.

It is to be noted that, as a technique of bonding between the first wiring section 1101 and the second wiring section 1102, an arbitrary technique may be used. For example, the first wiring section 1101 and the second wiring section 1102 may be bonded with use of a technique such as plasma bonding or room-temperature bonding. Moreover, the first wiring section 1101 and the second wiring section 1102 may be formed with use of, for example, a forming technique described in literature such as Japanese Unexamined Patent Application Publication No. 2004-63859.

The first wiring section 1101 includes a first semiconductor substrate (not illustrated), a first SiO2 layer 1011, a first Cu wiring line 1012 (a first wiring line), a first Cu barrier film 1013, and a first Cu diffusion prevention film 1014. The first wiring section 1101 further includes the first interlayer insulating film 1015, a first Cu bonding section 1010 (a first bonding section) including three first bonding electrodes 1016 (first electrodes), a first Cu barrier layer 1017, and three vias 1018.

The first SiO2 layer 1011 is formed on the first semiconductor substrate. Moreover, the first Cu wiring line 1012 is so formed as to be embedded in a surface located farther from the first semiconductor substrate of the first SiO2 layer 1011. It is to be noted that the first Cu wiring line 1012 is connected to, for example, a predetermined element, circuit, or the like in the semiconductor device 1100 (not illustrated).

The first Cu barrier film 1013 is formed between the first SiO2 layer 1011 and the first Cu wiring line 1012. It is to be noted that the first Cu barrier film 1013 is a thin film for preventing diffusion of copper (Cu) from the first Cu wiring line 1012 to the first SiO2 layer 1011, and may be formed of, for example, Ti, Ta, Ru, or a nitride thereof.

The first Cu diffusion prevention film 1014 is disposed on regions of the first SiO2 layer 1011, the first Cu wiring line 1012, and the first Cu barrier film 1013, except for regions where the vias 1018 are formed. It is to be noted that the first Cu diffusion prevention film 1014 is a thin film for preventing diffusion of copper (Cu) from the first Cu wiring line 1012 to the first interlayer insulating film 1015, and may be configured of, for example, a thin film made of SiC, SiN, SiCN, or the like. Moreover, the first interlayer insulating film 1015 is disposed on the first Cu diffusion prevention film 1014.

Three first bonding electrodes 1016 configuring the first Cu bonding section 1010 are so disposed as to be embedded in a surface located farther from the first Cu diffusion prevention film 1014 of the first interlayer insulating film 1015. It is to be noted that, at this time, each of the first bonding electrodes 1016 is connected to the via 1018 corresponding thereto. Moreover, the first bonding electrodes 1016 are formed of Cu.

It is to be noted that, as illustrated in FIG. 9, each of the first bonding electrodes 1016 is configured of a stick-like electrode extending in a predetermined direction (a first direction). A section orthogonal to the extending direction of each of the first bonding electrodes 1016 is rectangular, the dimensions and shape of the rectangular section are uniform in the extending direction. Moreover, in this embodiment, the three first bonding electrodes 1016 are arranged in parallel at predetermined intervals in a direction orthogonal to the extending direction of the first bonding electrodes 1016.

The first Cu barrier layer 1017 is disposed between three first bonding electrodes 1016 and three vias 1018, and the first interlayer insulating film 1015, and is so disposed as to cover the three first bonding electrodes 1016 and the three vias 1018. It is to be noted that the first Cu barrier layer 1017 may be formed of, for example, Ti, Ta, Ru, or a nitride thereof.

The vias 1018 are vertical hole wiring lines electrically connecting the first Cu wiring line 1012 and the first bonding electrode 1016 to each other, and are formed of Cu. Moreover, in this embodiment, as illustrated in FIGS. 9 and 10, the three vias 1018 are electrically and separately connected to the first Cu wiring line 1012 through the first Cu barrier layer 1017.

On the other hand, the second wiring section 1102 includes a second semiconductor substrate (not illustrated), a second SiO2 layer 1021, a second Cu wiring line 1022 (a second wiring line), a second Cu barrier film 1023, and a second Cu diffusion prevention film 1024. The second wiring section 1102 further includes a second interlayer insulating film 1025, a second Cu bonding section 1020 (a second bonding section) including three second bonding electrodes 1026 (second electrodes), a second Cu barrier layer 1027, and three vias 1028. It is to be noted that, in the second wiring section 1102, configurations other than the second Cu bonding section 1020 are similar to configurations corresponding thereto of the first wiring section 1101; therefore, only the configuration of the second Cu bonding section 1020 will be described here.

The second Cu bonding section 1020 is configured of three second bonding electrodes 1026, and the three second bonding electrodes 1026 are so disposed as to be embedded in a surface located farther from the second Cu diffusion prevention film 1024 of the second interlayer insulating film 1025. It is to be noted that, at this time, each of the second bonding electrodes 1026 is connected to the via 1028 corresponding thereto. Moreover, the second bonding electrodes 1026 are formed of Cu.

As illustrated in FIG. 9, each of the second bonding electrodes 1026 is configured of a stick-like electrode extending in a predetermined direction (a second direction), as with the first bonding electrodes 1016. Then, in this embodiment, the three second bonding electrodes 1026 are disposed in parallel at predetermined intervals in a direction orthogonal to the extending direction of the second bonding electrodes 1026.

Then, in this embodiment, as illustrated in FIG. 9, the second bonding electrodes 1026 are so formed as to allow the extending direction (the second direction) of the second bonding electrodes 1026 to be orthogonal to the extending direction (the first direction) of the first bonding electrodes 1016. It is to be noted that, in this embodiment, configurations (for example, the shape, size, pitch, number, and the like) of the second bonding electrodes 1026 other than the extending direction are similar to those of the first bonding electrodes 1016.

An intersection angle $\alpha$ between the extending direction of the first bonding electrodes 1016 and the extending direction of the second bonding electrodes 1026 is set to a value within a range of 0 degrees$<\alpha<$180 degrees (refer to FIG. 11 which will be described later). The intersection angle $\alpha$ is appropriately determined depending on, for example, application of the semiconductor device 1100 in consideration of desired specifications (a resistance value, a bonding pitch, and the like) for the Cu bonding sections, alignment precision of an alignment apparatus, an estimated rotational displacement amount of the semiconductor substrate at the time of bonding, and the like. However, in terms of reduction in contact resistance at the bonding interface Sj, the intersection angle α may be preferably set to around 0 degrees or 180 degrees to expand a contact area. Moreover, in terms of improvement in precision of bonding alignment, the intersection angle α may be preferably set to around 90 degrees.

Here, in the semiconductor device 1100 with the above-described configuration, a configuration of a bonding region between Cu electrodes formed between the first Cu bonding section 1010 and the second Cu bonding section 1020 is illustrated in FIG. 11. As described above, in this embodiment, since the extending direction of the first bonding electrodes 1016 and the extending direction of the second bonding electrodes 1026 intersect with each other, a bonding region 1103 between the Cu electrodes is formed in an intersection region between the first bonding electrode 1016 and the second bonding electrode 1026.

It is to be noted that, in this embodiment, an example in which each Cu bonding section (the first Cu bonding section 1010 or the second Cu bonding section 1020) is configured of three bonding electrodes (the first bonding electrodes 1016 or the second bonding electrode 1026) is described; however, the present technology is not limited thereto. The number of bonding electrodes configuring each Cu bonding section may be arbitrarily set, and may be set, for example, within a range of 1 to about 100.

Moreover, the size (for example, an extending length, a width, a thickness, and the like) of each bonding electrode and an arrangement interval (pitch) of the bonding electrode is arbitrarily set in consideration of, for example, conditions such as design rules and estimated bonding misalignment. For example, the width of each bonding electrode and the pitch of the bonding electrode may be set to about 0.1 μm to 5 μm. However, in terms of reduction in contact resistance at the bonding interface Sj, the width of each bonding electrode may be preferably as large as possible within an allowable range in the design rules. Moreover, in terms of ease of fabrication of the Cu bonding section, a ratio between the width of the bonding electrode and a distance between adjacent bonding electrodes may be preferably 1:1.

Further, in this embodiment, an example in which a via is disposed around one end of the bonding electrode (the first Cu bonding section 1010 or the second Cu bonding section 1020) is described; however, the present technology is not limited thereto, and the via may be disposed at any position of the bonding electrode. For example, the via may be disposed at a position corresponding to a bonding region between the Cu electrodes of the bonding electrodes.

As described above, in the semiconductor device 1100 according to this embodiment, the first bonding electrodes 1016 and the second bonding electrodes 1026 are so bonded as to intersect with each other; therefore, even if bonding misalignment between the bonding electrodes at the time of bonding occurs, the area of the bonding region 1103 between the Cu electrodes is not changed. It is to be noted that, in a case where rotational displacement occurs at the time of bonding, the area of the bonding region 1103 between the Cu electrodes is slightly deviated from a desired area. However, as described above, the configuration of each Cu bonding section is set also in consideration of the rotational displacement amount of the semiconductor substrate; therefore, even if rotational displacement occurs at the time of bonding, variations in area of the bonding region 1103 between Cu electrodes may be limited to an estimated range.

Therefore, in this embodiment, even if bonding misalignment occurs, a desired area of the bonding region 1103 between the Cu electrodes is obtainable, and variations in contact resistance at the bonding interface Sj are allowed to be suppressed. It is to be noted that, in this embodiment, bonding electrodes and insulation sections are alternately arranged in the bonding surface of the Cu bonding section; therefore, a bonding electrode portion with a wide width is eliminated, and the issue of dishing is allowed to be solved.

Thus, in this embodiment, for example, occurrence of a conduction failure, an increase in contact resistance, and the like at the bonding interface Sj are allowed to be further suppressed, and the semiconductor device 1100 having a more reliable bonding interface Sj is allowed to be provided. Moreover, in this embodiment, since an increase in contact resistance at the bonding interface Sj is allowed to be suppressed, an increase in power consumption of the semiconductor device 1100 and delay of processing speed are allowed to be suppressed.

Eighth Embodiment

FIG. 12 illustrates a schematic configuration of a semiconductor device according to a second embodiment. FIG. 12 is a schematic perspective view of each Cu bonding section of the semiconductor device according to this embodiment. It is to be noted that, in FIG. 12, for simplification of description, only a schematic configuration around one bonding region between Cu electrodes is illustrated. Moreover, in FIG. 12, for simplification of description, only an electrode section is illustrated, and a Cu barrier layer, an interlayer insulating film, and the like disposed around the electrode section are not illustrated. Further, in FIG. 12, to more clearly illustrate the configuration of each Cu bonding section, respective Cu bonding sections are separately illustrated. In addition, in the semiconductor device according to this embodiment illustrated in FIG. 12, like components are denoted by like numerals as of the semiconductor device 1100 according to the seventh embodiment illustrated in FIG. 9.

Although not illustrated in FIG. 12, as with the seventh embodiment, a semiconductor device 1110 according to this embodiment includes a first wiring section (a first semiconductor section) including a first Cu bonding section 1030 (a first bonding section) and a second wiring section (a second semiconductor section) including a second Cu bonding section 1040 (a second bonding section). Then, the semiconductor device 1110 is formed by cementing (bonding) the first wiring section and the second wiring section together with use of a technique such as plasma bonding or room-temperature bonding.

It is to be noted that, in this embodiment, configurations other than the first Cu bonding section 1030 and the second Cu bonding section 1040 are similar to those in the above-described seventh embodiment (FIG. 10); therefore, only the configurations of the first Cu bonding section 1030 and the second Cu bonding section 1040 will be described here.

As illustrated in FIG. 12, the first Cu bonding section 1030 includes three first bonding electrode sections 1031 (first electrodes) and a first extraction electrode section 1032 (a first extraction electrode). It is to be noted that, in this embodiment, the first Cu bonding section 1030 is connected to the first Cu wiring line 1012 through one via 1018.

The first bonding electrode sections 1031 are allowed to be configured in a way similar to the first bonding electrodes 1016 in the above-described seventh embodiment. Therefore, configurations, for example, the shape, size, pitch, number, and the like of the first bonding electrode sections 1031 in this embodiment are not limited to an example illustrated in FIG. 12, and may be appropriately modified, as with the first bonding electrodes 1016 in the above-described seventh embodiment.

The first extraction electrode section 1032 is connected to one end of each of three first bonding electrode sections 1031. Moreover, the first extraction electrode section 1032 is connected to one via 1018, and is electrically connected to the first Cu wiring line 1012 through the via 1018. In other words, in this embodiment, three first bonding electrode sections 1031 are electrically connected to the first Cu wiring line 1012 through the first extraction electrode section 1032 and the via 1018. It is to be noted that the configurations, for example, the shape, size, and the like of the first extraction electrode section 1032 is appropriately determined in consideration of, for example, conditions such as design rules.

On the other hand, as illustrated in FIG. 12, the second Cu bonding section 1040 includes three second bonding electrode sections 1041 (second electrodes) and a second extraction electrode section 1042 (a second extraction electrode). It is to be noted that, in this embodiment, the second Cu bonding section 1040 is connected to the second Cu wiring line 1022 through one via 1028.

The second bonding electrode sections 1041 are allowed to be configured in a way similar to the second bonding electrodes 1026 in the above-described seventh embodiment. Therefore, configurations, for example, the shape, size, pitch, number, and the like of the second bonding electrode sections 1041 in this embodiment are not limited to the example illustrated in FIG. 12, and may be appropriately modified, as with the second bonding electrodes 1026 in the above-described seventh embodiment. Moreover, in this embodiment, the configurations (for example, the shape, size, pitch, number, and the like) other than the extending direction of the second bonding electrode sections 1041 are similar to those of the first bonding electrode sections 1031.

The second extraction electrode section 1042 is connected to one end of each of the three second bonding electrode sections 1041. Moreover, the second extraction electrode section 1042 is connected to one via 1028, and is electrically connected to the second Cu wiring line 1022 through the via 1028. In other words, in this embodiment, three second bonding electrode sections 1041 are electrically connected to the second Cu wiring line 1022 through the second extraction electrode section 1042 and the via 1028. It is to be noted that the configurations, for example, the shape, size, and the like of the second extraction electrode section 1042 are appropriately determined in consideration of conditions such as design rules, as with the first extraction electrode section 1032.

Then, in this embodiment, as illustrated in FIG. 12, the first Cu bonding section 1030 and the second Cu bonding section 1040 are so bonded as to allow the extending direction of the first bonding electrode sections 1031 of the first Cu bonding section 1030 and the extending direction of the second bonding electrode sections 1041 of the second Cu bonding section 1040 to intersect with each other.

It is to be noted that an intersection angle α between the extending direction of the first bonding electrode sections 1031 and the extending direction of the second bonding electrode sections 1041 is set to a value within a range of 0 degrees<α<180 degrees, as with the above-described seventh embodiment. Moreover, in this embodiment, as with the above-described seventh embodiment, the intersection angle α is appropriately determined in consideration of, for example, conditions such as desired specifications for the Cu bonding sections, alignment precision of an alignment apparatus, an estimated rotational displacement amount of the semiconductor substrate at the time of bonding, and the like.

As described above, also in this embodiment, the extending direction of the first bonding electrode sections 1031 and the extending direction of the second bonding electrode sections 1041 intersect with each other; therefore, even if bonding misalignment between them occurs, variations in a contact area (contact resistance) between them are allowed to be sufficiently suppressed. Accordingly, in the semiconductor device 1110 according to this embodiment, effects similar to those in the above-described seventh embodiment are obtainable.

Ninth Embodiment

FIG. 13 illustrates a schematic configuration of a semiconductor device according to a ninth embodiment. FIG. 13 is a schematic perspective view of a Cu bonding section of the semiconductor device according to this embodiment. It is to be noted that, in FIG. 13, for simplification of description, only a schematic configuration around one bonding region between Cu electrodes is illustrated. Moreover, in FIG. 13, for simplification of description, only an electrode section is illustrated, and a Cu barrier layer, an interlayer insulating film, and the like disposed around the electrode section are not illustrated. Further, in FIG. 13, to more clearly illustrate the configuration of each Cu bonding section, respective Cu bonding sections are separately illustrated. In addition, in the semiconductor device according to this embodiment illustrated in FIG. 13, like components are denoted by like numerals as of the semiconductor device 1100 according to the seventh embodiment illustrated in FIG. 9.

Although not illustrated in FIG. 13, as with the seventh embodiment, a semiconductor device 1120 according to this embodiment includes a first wiring section (a first semiconductor section) including a first Cu bonding section 1050 (a first bonding section) and a second wiring section (a second semiconductor section) including a second Cu bonding section 1060 (a second bonding section). Then, the semiconductor device 1120 is formed by cementing (bonding) the first wiring section and the second wiring section together with use of a technique such as plasma bonding or room-temperature bonding.

It is to be noted that, in this embodiment, configurations other than the first Cu bonding section 1050 and the second Cu bonding section 1060 are similar to those in the above-described seventh embodiment (FIG. 10); therefore, only the configurations of the first Cu bonding section 1050 and the second Cu bonding section 1060 will be described here.

As illustrated in FIG. 13, the first Cu bonding section 1050 is configured of a plate-like electrode member in which three first slits 1051 with a rectangular opening shape are formed. It is to be noted that, in this embodiment, the first Cu bonding section 1050 is connected to the first Cu wiring line 1012 through one via 1018.

The three first slits 1051 are disposed at predetermined intervals along a short-side direction of the first slits 1051 in a plane of the first Cu bonding section 1050. Therefore, the first Cu bonding section 1050 has a configuration in which first bonding electrode sections 1052 (first electrodes) are formed between long-side sections of adjacent first slits 1051, and outside the first slits 1051 located at outermost sides. In other words, the first Cu bonding section 1050 has a configuration in which four first bonding electrode sections 1052 extending along a long-side direction of the first slits 1051 are disposed with the first slits 1051 in between along the short-side direction of the first slits 1051.

It is to be noted that the first bonding electrode sections 1052 are allowed to be configured in a way similar to the first bonding electrodes 1016 in the above-described seventh embodiment. Therefore, configurations, for example, the shape, size, pitch, number, and the like of the first bonding electrode sections 1052 in this embodiment are not limited to an example illustrated in FIG. 13, and may be appropriately modified, as with the first bonding electrodes 1016 in the above-described seventh embodiment.

Moreover, the first Cu bonding section 1050 has a configuration in which one end and the other end of each of four first bonding electrode sections 1052 are connected to respective two first extraction electrode sections 1053. Then, one of the first extraction electrode sections 1053 is connected to one via 1018, and is electrically connected to the first Cu wiring line 1012 through the via 1018. In other words, in this embodiment, the four first bonding electrode sections 1052 are electrically connected to the first Cu wiring line 1012 through the first extraction electrode section 1053 and the via 1018. It is to be noted that the configurations, for example, the shape, size, and the like of each of the first extraction electrode sections 1053 are similar to those in the first extraction electrode section 1032 in the above-described second embodiment.

On the other hand, as illustrated in FIG. 13, the second Cu bonding section 1060 is configured of a plate-like electrode member in which three second slits 1061 with a rectangular opening shape are formed, as with the first Cu bonding section 1050. It is to be noted that, in this embodiment, the second Cu bonding section 1060 is connected to the second Cu wiring line 1022 through one via 1028.

The three second slits 1061 are disposed at predetermined intervals along a short-side direction of the second slits 1061 in a plane of the second Cu bonding section 1060. Therefore, the second Cu bonding section 1060 has a configuration in which second bonding electrode sections 1062 (second electrodes) are formed between long-side sections of adjacent second slits 1061, and outside the second slits 1061 located at outermost sides. In other words, the second Cu bonding section 1060 has a configuration in which four second bonding electrode sections 1062 extending along a long-side direction of the second slits 1061 are disposed with the second slits 1061 in between along the short-side direction of the second slits 1061.

It is to be noted that the second bonding electrode sections 1062 are allowed to be configured in a way similar to the second bonding electrodes 1026 in the above-described seventh embodiment. Therefore, configurations, for example, the shape, size, pitch, number, and the like of the second bonding electrode sections 1062 in this embodiment are not limited to the example illustrated in FIG. 13, and may be appropriately modified, as with the second bonding electrodes 1026 in the above-described seventh embodiment. Moreover, in this embodiment, the configurations (for example, the shape, size, pitch, number, and the like) other than the extending direction of the second bonding electrode sections 1062 are similar to those of the first bonding electrode sections 1052.

Moreover, the second Cu bonding section 1060 has a configuration in which one end and the other end of each of four second bonding electrode sections 1062 are connected to respective two second extraction electrode sections 1063. Then, one of the second extraction electrode sections 1063 is connected to one via 1028, and is electrically connected to the second Cu wiring line 1022 through the via 1028. In other words, in this embodiment, the four second bonding electrode sections 1062 are electrically connected to the second Cu wiring line 1022 through the second extraction electrode section 1063 and the via 1028. It is to be noted that the configurations, for example, the shape, size, and the like of each of the second extraction electrode sections 1063 are similar to those of the second extraction electrode section 1042 in the above-described eighth embodiment.

Then, in this embodiment, as illustrated in FIG. 13, the first Cu bonding section 1050 and the second Cu bonding section 1060 are so bonded as to allow the extending direction of the first bonding electrode sections 1052 of the first Cu bonding section 1050 and the extending direction of the second bonding electrode sections 1062 of the second Cu bonding section 1060 to intersect with each other.

Here, a configuration of a bonding region between Cu electrodes formed between the first Cu bonding section 1050 and the second Cu bonding section 1060 in the semiconductor device 1120 with the above-described configuration is illustrated in FIG. 14. In this embodiment, bonding regions 1121 and 1122 between Cu electrodes are formed in intersection regions between the first bonding electrode sections 1052 and the second bonding electrode sections 1062, and an outer region of each Cu bonding section, respectively.

It is to be noted that an intersection angle α between the extending direction of the first bonding electrode sections 1052 and the extending direction of the second bonding electrode sections 1062 is set to a value within a range of 0 degrees<α<180 degrees, as with the above-described seventh embodiment. Moreover, in this embodiment, as with the above-described seventh embodiment, the intersection angle α is appropriately determined in consideration of, for example, conditions such as desired specifications for the Cu bonding sections, alignment precision of an alignment apparatus, an estimated rotational displacement amount of the semiconductor substrate at the time of bonding, and the like.

In the above-described configuration, even if bonding misalignment occurs, an area of the bonding section 1121 between the Cu electrodes formed in an intersection region between the first bonding electrode section 1052 and the second bonding electrode section 1062 is not changed, as with the above-described seventh embodiment. On the other hand, when bonding misalignment occurs, an area of the bonding region 1122 between the Cu electrodes formed in an outer region of each Cu bonding section is slightly changed.

In other words, in this embodiment, when bonding misalignment occurs, a contact area (contact resistance) between the first Cu bonding section 1050 and the second Cu bonding section 1060 is changed by a change in the area of the bonding region 1122 between the Cu electrodes formed in the outer region of each Cu bonding section. However, for example, in the semiconductor device with the configuration illustrated in FIG. 7, when bonding misalignment occurs, the contact area (contact resistance) is changed not only in the outer region of the Cu bonding section but also a region (an inner region) between insulating films. Therefore, in this embodiment, for example, compared to the semiconductor device with the configuration illustrated in FIG. 7, variations in contact area (contact resistance) between the first Cu bonding section 1050 and the second Cu bonding section 1060 at the bonding interface Sj are allowed to be suppressed.

As described above, also in this embodiment, the extending direction of the first bonding electrode sections 1052 and the extending direction of the second bonding electrode sections 1062 intersect with each other. Therefore, even if bonding misalignment occurs at the time of bonding, variations in contact area (contact resistance) between the first Cu bonding section 1050 and the second Cu bonding section 1060 are allowed to be sufficiently suppressed, and effects similar to those in the above-described seventh embodiment are obtainable.

Tenth Embodiment

The configurations (techniques of bonding Cu electrodes together) of respective Cu bonding sections in the above-described seventh to ninth embodiments are applicable to any of semiconductor devices (for example, a solid-state image pickup device, a semiconductor memory, and the like) in which wiring bonding is performed by bonding two semiconductor members together. In a tenth embodiment, an example in which any of the configurations (techniques of bonding Cu electrodes together) of the respective Cu bonding sections in the above-described seventh to ninth embodiments is applied to a solid-state image pickup device will be described.

FIG. 15 illustrates a schematic sectional view of a main part of a solid-state image pickup device according to the tenth embodiment. It is to be noted that, in FIG. 15, for simplification of description, a Cu barrier layer (a Cu barrier film) formed between a Cu bonding section and a via, and an interlayer insulating film is not illustrated.

A solid-state image pickup device 1200 according to this embodiment includes a first semiconductor member 1201 including photoelectric conversion sections 1210 and a second semiconductor member 1202 including various MOS (Metal-Oxide-Semiconductor) transistors 1220 that configure an arithmetic circuit. Moreover, the solid-state image pickup device 1200 includes color filters 1203 and on-chip microlenses 1204.

In the solid-state image pickup device 1200 according to this embodiment, the first semiconductor member 1201 and the second semiconductor member 1202 are bonded together at the bonding interface Sj. Moreover, in this embodiment, the color filters 1203 and the on-chip microlenses 1204 are laminated in this order on a surface (a photoelectric conversion layer 211) farther from the second semiconductor member 1202 of the first semiconductor member 1201.

The first semiconductor member 1201 includes a photoelectric conversion layer 1211 including photoelectric conversion sections 1210, and a first multilayer wiring section 1212 disposed on a side farther from the color filters 1203 of the photoelectric conversion layer 1211.

The first multilayer wiring section 1212 is configured by laminating a plurality of first Cu wiring layers 1213. Each of the first Cu wiring layers 1213 includes an interlayer insulating film 1214, first Cu bonding sections 1215 embedded in the interlayer insulating film 1214, and vias 1216 provided to obtain electrical connection with a layer (the first Cu wiring layer 1213 or the photoelectric conversion layer 1211) located closer to the color filters 1203 than the via 1216. Moreover, in this embodiment, Cu diffusion prevention films 1217 are deposed between adjacent first Cu wiring layers 1213 and between the first Cu wiring layer 1213 and the photoelectric conversion layer 1211.

On the other hand, the second semiconductor member 1202 includes a transistor section 1221 in which various MOS transistors 1220 configuring an arithmetic circuit are formed, and a second multilayer wiring section 1222 disposed on a side closer to the first semiconductor member 1201 of the transistor section 1221.

The second multilayer wiring section 1222 is configured by laminating a plurality of second Cu wiring layers 1223. Each of the second Cu wiring layers 1223 includes an interlayer insulating film 1224, second Cu bonding sections 1225 embedded in the interlayer insulating film 1224, and vias 1226 provided to obtain electrical connection with a layer (the second Cu wiring layer 1223 or the transistor section 1221) located closer to the transistor section 1221 than the vias 1226. Moreover, in this embodiment, Cu diffusion prevention films 1227 are disposed between adjacent second Cu wiring layers 1223 and between the second Cu wiring layer 1223 and the transistor section 1221.

In the solid-state image pickup device 1200 with the above-described configuration, configurations of the first Cu bonding section and the second Cu bonding section in any of the above-described seventh to ninth embodiments are applied to the first Cu bonding section 1215 and the second Cu bonding section 1225, respectively, that are bonded together with the bonding interface Sj in between. In this case, the solid-state image pickup device 1200 having a more reliable bonding interface Sj is obtainable.

EXAMPLES

Examples of the above-described first to sixth embodiments and a comparative example will be described below.

Example 1

The semiconductor device 100 illustrated in the first embodiment (refer to FIGS. 1A to 1C) was fabricated, and a void inspection with use of ultrasonic waves was performed on a bonding surface between the first semiconductor member 10 and the second semiconductor member 20. It is to be noted that, in the first semiconductor member 10 and the second semiconductor member 20, the first electrode pads 4 and the second electrode pads 7 embedded in the interlayer insulating films 3 and 6, respectively, were formed by a typical damascene process. Moreover, surfaces of the first semiconductor member 10 and the second semiconductor member 20 were polished with use of a typical CMP pad in which a soft layer and a hard layer were laminated and typical slurry for manufacturing of semiconductor devices.

Next, the polished surfaces of the first semiconductor member 10 and the second semiconductor member 20 were brought into contact with each other so as to face each other. Then, temporary bonding was performed by pressing a center of the second semiconductor member 20 with a load of 12 N with use of a pin. After that, heat treatment was performed at 350° C. to bond the first semiconductor member 10 and the second semiconductor member 20 together.

As a result of performing the void inspection with use of ultrasonic waves, it was confirmed that generation of voids was not observed, and bonding was securely performed at the entire bonding surface. It is to be noted that, when bond strength between the first semiconductor member 10 and the second semiconductor member 20 was tried to be measured by a razor blade test described in the above-described NTL 2, bonding surfaces between the electrode pads and between dummy electrodes were not peeled, and precise measurement was not possible. In other words, it was confirmed that the first semiconductor member 10 and the second semiconductor member 20 were firmly bonded together to such an extent that bond strength was not measurable by a measurement method in related art.

Example 2

The semiconductor device 200 (refer to FIGS. 2A to 2C) illustrated in the second embodiment was fabricated by a method similar to that in Example 1, and a void inspection with use of ultrasonic waves was performed. It is to be noted that, in the bonding surface of the first semiconductor member 10, a ratio of surface areas of the first electrode pads 4 and the dummy electrodes 5 to a surface area of the interlayer insulating film 3 was within a range of 50% to 60%.

As a result of performing the void inspection with use of ultrasonic waves on the semiconductor device 200, it was able to be confirmed that generation of voids was not observed, and bonding was securely performed at the entire bonding surface. Moreover, bond strength was ••.

Example 3

When the semiconductor device 300 (refer to FIG. 3) illustrated in the third embodiment was fabricated by a method similar to that in Example 1, and a void inspection with use of ultrasonic waves was performed, it was able to be confirmed that generation of voids was not observed, and bonding was securely performed. Moreover, bond strength was ••.

Example 4

When the semiconductor device 400 (refer to FIG. 4A) illustrated in the fourth embodiment was fabricated by a method similar to that in Example 1, and a void inspection with use of ultrasonic waves was performed, it was able to be confirmed that generation of voids was not observed, and bonding was securely performed. Moreover, bond strength was ••.

Moreover, the semiconductor device 410 illustrated in FIG. 4B was fabricated in a similar way, and a void inspection with use of ultrasonic waves was performed. It is to be noted that, in the bonding surface of the first semiconductor member 10, a ratio of surface areas of the first electrode pads 4 and the dummy electrodes 5 to a surface area of the interlayer insulating film 3 was within a range of 50% to 60%. It was confirmed that, also in this semiconductor device 410, voids were not generated in the bonding surface, and bonding was securely performed.

Example 5

The semiconductor image reception device illustrated in the sixth embodiment was fabricated, and a void inspection with use of ultrasonic waves was performed. The first semiconductor member 10 and the second semiconductor member 20 were fabricated with use of a typical semiconductor process, and surfaces to be bonded together were polished by a CMP method. Next, as with Example 1, temporary bonding between the first semiconductor member 10 and the second semiconductor member 20 was performed, and after that, heat treatment was performed at 350° C. to complete bonding.

Also in this case, it was confirmed that voids were not generated in the bonding surface between the first semiconductor member 10 and the second semiconductor member 20, and peeling at the bonding surface, a reduction in reliability and the like due to vulnerability of a bonding part did not occur.

Comparative Example

As a comparative example, a semiconductor device 100a with a configuration in which dummy electrodes were not provided was fabricated. FIG. 16A is a diagram illustrating a bonding surface of a first semiconductor member 10a of the semiconductor device 100a according to the comparative example. Moreover, FIG. 16B is a sectional view of the semiconductor device 100a taken along a line L6 of FIG. 2A. Moreover, FIG. 16C is a sectional view of the semiconductor device 100a taken along a line L7 of FIG. 16A. The semiconductor device 100a was similar to the semiconductor device 100, except that the dummy electrodes 5 and 8 were not provided, compared to the semiconductor device 100.

In a first semiconductor member 10a and a second semiconductor member 20a, first electrode pads 4a and second electrode pads 7a embedded in interlayer insulating films 3a and 6a, respectively, were formed by a typical damascene process. Moreover, the bonding surface Pj between the first semiconductor member 10a and the second semiconductor member 20a was polished with use of a typical CMP pad in which a soft layer and a hard layer were laminated and typical slurry for manufacturing of semiconductor devices. Bonding between the first semiconductor member 10a and the second semiconductor member 20a was performed in a way similar to that in Example 1.

As illustrated in FIG. 16B, voids were not formed in the bonding surface between the first semiconductor member 10a and the second semiconductor member 20a in a position illustrated by the line L6 in FIG. 16A. However, in a position illustrated by the line L7 in FIG. 16A, a void was formed between the first electrode pad 4a and the second electrode pad 7a, as illustrated in FIG. 16C. This was because dishing occurred in the bonding surface between the first electrode pad 4a and the second electrode pad 7a when the bonding surface of each semiconductor member was formed.

Thus, in Examples 1 to 5 in which dummy electrodes were provided by the present technology, voids were not formed in the bonding surface; therefore, semiconductor devices in which two semiconductor members were firmly bonded together were allowed to be provided. Moreover, the dummy electrodes 5 and 8 were allowed to be formed simultaneously when the first electrode pads 4 and the second electrode pads 7 were formed; therefore, bond strength was allowed to be enhanced without increasing the number of manufacturing processes.

(Various modification examples and application examples)

Next, modification examples and application examples (applications) of the above-described seventh to ninth embodiments will be described below.

Modification Example 1

In the above-described seventh to ninth embodiments, an example in which bonding electrodes (bonding electrode sections) that linearly extend are used is described; however, the present technology is not limited thereto. As long as a configuration in which the extending direction of the first bonding electrodes (the first bonding electrode sections) of the first Cu bonding section and the extending direction of the second bonding electrodes (the second bonding electrode sections) of the second Cu bonding section are so configured as to intersect with each other is adopted, the shape of each of the bonding electrodes (bonding electrode sections) may be determined arbitrarily. For example, the extending direction of the bonding electrodes (the bonding electrode sections) may be bended at some point. Such an example (Modification Example 1) is illustrated in FIG. 17.

In this example, as illustrated in FIG. 17, each of a first bonding electrode 1131 of the first Cu bonding section and a second bonding electrode 1132 of the second Cu bonding section is configured of a stick-like electrode extending in a "L"-letter like shape. Then, also in this example, the first bonding electrode 1131 and the second bonding electrode 1132 are bonded together so as to intersect with each other at the intersection angle α in a range of 0 degrees<α<180 degrees. However, in this example, the extending shape of each bonding electrode is a "L"-letter like shape; therefore, as illustrated in FIG. 17, two bonding regions 1133 between Cu electrodes are formed between one first bonding electrode 1131 and one second bonding electrode 1132.

Also in this configuration of this example, the extending direction of the first bonding electrode 1131 and the extending direction of the second bonding electrode 1132 intersect with each other; therefore, even if bonding misalignment occurs when bonding them, variations in contact area (contact resistance) between them are allowed to be sufficiently suppressed. Accordingly, also in the semiconductor device in this example, effects similar to those in the above-described seventh embodiment are obtainable.

It is to be noted that, in FIG. 17, an example in which both the first bonding electrode 1131 and the second bonding electrode 1132 are configured of stick-like electrodes extending in a "L"-letter like shape is illustrated; however, the present technology is not limited thereto. For example, either of the first bonding electrode 1131 and the second bonding electrode 1132 may be configured of a stick-like electrode that extends linearly, as with the above-described seventh embodiment.

Modification Example 2

In the above-described seventh to ninth embodiments, an example in which configurations (for example, the shape, size, pitch, number, and the like) of the first bonding electrodes (the first bonding electrode sections) other than the extending direction are similar to those of the second bonding electrodes (the second bonding electrode sections) is described; however, the present technology is not limited thereto. As long as the extending direction of the first bonding electrodes (the first bonding electrode sections) and the extending direction of the second bonding electrodes (the second bonding electrode sections) are so configured as to intersect with each other, configurations other than the extending directions of the first and second bonding electrodes may be different from each other.

For example, at least one configuration of the shape, size, pitch, and number of the first bonding electrodes (the first bonding electrode sections) of the first Cu bonding section may be different from that of the second bonding electrodes (the second bonding electrode sections) of the second Cu bonding section.

Moreover, configurations of respective Cu bonding sections in the above-described seventh to ninth embodiments may be appropriately combined to allow the configuration of the first Cu bonding section and the configuration of the second Cu bonding section to be different from each other.

For example, the configuration in the seventh embodiment (FIG. 9) may be applied to one of the first Cu bonding section and the second Cu bonding section, and the configuration in the eighth embodiment (FIG. 12) may be applied to the other Cu bonding section. Further, for example, the configuration in the seventh embodiment (FIG. 9) may be applied to one of the first Cu bonding section and the second Cu bonding section, and the configuration in the ninth embodiment (FIG. 13) may be applied to the other Cu bonding section. Furthermore, for example, the configuration in the eighth embodiment (FIG. 12) may be applied to one of the first Cu bonding section and the second Cu bonding section, and the configuration in the ninth embodiment (FIG. 13) may be applied to the other Cu bonding section.

Modification Example 3

In the above-described seventh to ninth embodiments, an example in which a formation material of the bonding electrodes (the bonding electrode sections) is Cu is described; however, the present technology is not limited thereto. For example, the bonding electrodes (the bonding electrode sections) may be formed of, for example, a material such as Al, W, Ti, TiN, Ta, TaN, or Ru.

Moreover, in the above-described various embodiments, an example in which bonding electrodes (the bonding electrode sections) made of Cu are bonded together is described; however, the present technology is not limited thereto. The formation material of one of the bonding electrodes (bonding electrode sections) may be different from that of the other bonding electrode (the bonding electrode section).

Modification Example 4

In the above-described eighth and ninth embodiments, an example in which each of the Cu bonding sections is electrically connected to an external Cu wiring line through one via is described. However, in this case, when the via has some trouble due to some kind of factor, a conduction failure may occur between the Cu bonding section and the Cu wiring line, thereby causing a reduction in product yields.

To solve this issue, as with the above-described seventh embodiment, a plurality of vias may be connected to each of the Cu bonding sections in the above-described eighth and ninth embodiments (Modification Example 4). In other words, in the semiconductor devices according to the above-described eighth and ninth embodiments, the Cu bonding section and the external Cu wiring line may be electrically connected to each other through a plurality of vias. It is to be noted that, in this case, positions where the plurality of vias are formed may be determined arbitrarily, and, for example, the plurality of vias may be formed on the extraction electrode section.

In the configuration of this example, even if one via of the plurality of vias has trouble, electrical connection between the Cu bonding section and the Cu wiring line is allowed to be maintained by other vias; therefore, the above-described issue is allowed to be solved.

Modification Example 5

In the above-described seventh to ninth embodiments, an example in which a technique of bonding between Cu electrodes in the present technology (a configuration in which bonding electrodes or bonding electrode sections intersect with each other) is adopted when Cu bonding sections connected to Cu wiring lines through vias (vertical hole wiring lines) are bonded together is described; however, the present technology is not limited thereto. For example, the technique of bonding between Cu electrodes in the present technology may be applied to a case where the first Cu wiring line 12 of the first wiring section (the first semiconductor section) and the second Cu wiring line 22 of the second wiring section (the second semiconductor section) are directly bonded together not through the Cu bonding section.

In this case, respective Cu wiring lines may be formed so as to allow the extending direction of the first Cu wiring line 1012 (first electrode) formed on a bonding surface of the first wiring section (the first semiconductor section) and the extending direction of the second Cu wiring line 1022 (second electrode) formed on a bonding surface of the second wiring section (the second semiconductor section) to intersect with each other. A configuration of this example is effective specifically in a case where a pattern of the Cu wiring line formed on the bonding surface of each wiring section is simple.

It is to be noted that, in the configuration of this example, Cu wiring lines may be directly bonded together on an entire region of the bonding interface Sj between the first wiring section and the second wiring section. Moreover, according to the wiring pattern of the bonding interface Sj, in some regions of the bonding interface Sj, Cu wiring lines may be directly bonded together, and in other regions, Cu wiring lines may be bonded together through the Cu bonding section.

Modification Example 6

In the above-described seventh to ninth embodiments, an example in which the technique of bonding between Cu electrodes in the present technology is applied to the semiconductor device is described; however, the present technology is not limited thereto. For example, the technique of bonding between Cu electrodes described in the above seventh to ninth embodiments may be also applied to a case where two wiring lines disposed on two respective substrates formed of a material other than semiconductors are bonded together, and similar effects are obtainable.

Modification Example 7

In the above-described various modification examples, modification examples of the above-described seventh to ninth embodiments are described; however, the present technology is not limited thereto. For example, some of configurations of the above-described seventh to ninth embodiments and the above-described modification examples 1 to 6 may be arbitrarily combined, depending on conditions such as application of the semiconductor device.

Application Examples

The semiconductor devices according to the above-described various embodiments and various modification examples are applicable to various electronic apparatuses. For example, each of the semiconductor image reception device 600 described in the above sixth embodiment and the solid-state image pickup device 1200 described in the above tenth embodiment is applicable to electronic apparatuses such as camera systems including digital cameras and video cameras, cellular phones having an image pickup function, and other apparatuses having an image pickup function. As a configuration example of an electronic apparatus, a camera will be described here.

FIG. 18 illustrates a schematic configuration of a camera according to an application example. It is to be noted that, in FIG. 18, a configuration example of a video camera capable of shooting a still image or moving images is illustrated.

A camera 1300 in this example includes a solid-state image pickup device 1301, an optical system 1302 guiding incident light to a light reception sensor (not illustrated) of the solid-state image pickup device 1301, a shutter device 1303 disposed between the solid-state image pickup device 1301 and the optical system 1302, and a drive circuit 1304 driving the solid-state image pickup device 1301. Moreover, the camera 1300 includes a signal processing circuit 1305 processing an output signal from the solid-state image pickup device 1301.

The solid-state image pickup device 1301 may be configured of, for example, the semiconductor image reception device 600 described in the above sixth embodiment or the solid-state image pickup device 1200 described in the above tenth embodiment. Configurations and functions of other components are as follows.

The optical system (an optical lens) 1302 forms an image of image light (incident light) from an object on an image pickup plane (not illustrated) of the solid-state image pickup device 1301. Therefore, a signal charge is stored in the solid-state image pickup device 1301 for a certain period. It is to be noted that the optical system 1302 may be configured of an optical lens group including a plurality of optical lenses. Moreover, the shutter device 1303 controls a light irradiation period and a light shielding period of incident light on the solid-state image pickup device 1301.

The drive circuit 1304 supplies a drive signal to the solid-state image pickup device 1301 and the shutter device 1303. Then, the drive circuit 1304 controls an operation of outputting a signal to the signal processing circuit 1305 of the solid-state image pickup device 1301 and a shutter operation of the shutter device 1303 by the supplied drive signal. In other words, in this example, an operation of transferring a signal from the solid-state image pickup device 1301 to the signal processing circuit 1305 is performed by a drive signal (a timing signal) supplied from the drive circuit 1304.

The signal processing circuit 1305 performs various kinds of signal processing on the signal transferred from the solid-state image pickup device 1301. Then, the signal (an image signal) subjected to various kinds of signal processing is stored in a storage medium such as a memory (not illustrated), or is output to a monitor (not illustrated).

Other Modification Examples

It is to be noted that the present technology is not limited to the above-described various embodiments and various modification examples, and may have any other various configurations without departing from the scope of the present technology.

It is to be noted that the present technology is allowed to have the following configurations.

(1) A semiconductor device including:

a first wiring layer including a first interlayer insulating film, a first electrode pad, and a first dummy electrode, the first electrode pad being embedded in the first interlayer insulating film and having one surface located on same plane as one surface of the first interlayer insulating film, and the first dummy electrode being embedded in the first interlayer insulating film, having one surface located on same plane as the one surface of the first interlayer insulating film, and being disposed around the first electrode pad; and a second wiring layer including a second interlayer insulating film, a second electrode pad, and a second dummy electrode, the second interlayer insulating film being located closer to the one surface of the first electrode pad of the first interlayer insulating film, the second electrode pad being embedded in the second interlayer insulating film, having one surface located on same surface as a surface located closer to the first interlayer insulating film of the second interlayer insulating film, and being bonded to the first electrode pad, and the second dummy electrode having one surface located on same plane as the surface located closer to the first interlayer insulating film of the second interlayer insulating film, being disposed around the second electrode pad, and being bonded to the first dummy electrode.

(2) The semiconductor device according to (1), in which the first electrode pad and the first dummy electrode are disposed plane-symmetrically to the second electrode pad and the second dummy electrode with respect to a bonding surface between the first wiring layer and the second wiring layer.

(3) The semiconductor device according to (1) or (2), in which a ratio of surface areas of the first electrode pad and the first dummy electrode to a surface area of the first interlayer insulating film on a bonding surface between the first wiring layer and the second wiring layer is within a range from 50% to 60% both inclusive.

(4) The semiconductor device according to any one of (1) to (3), in which all of the first and second dummy electrodes are connected to a ground.

(5) The semiconductor device according to any one of (1) to (4), in which the first electrode pad and the first dummy electrode have a same outside shape, and are all disposed at equal intervals.

(6) The semiconductor device according to any one of (1) to (4), in which the first dummy electrode is disposed only around the first electrode pad on a bonding surface between the first wiring layer and the second wiring layer.

Moreover, the present technology is allowed to have the following configurations.

(7) A semiconductor device including:

a first semiconductor section including a first electrode, the first electrode being formed on a surface located closer to a bonding interface and extending in a first direction; and a second semiconductor section including a second electrode and disposed to be bonded to the first semiconductor section at the bonding interface, the second electrode being bonded to the first electrode at the bonding interface and extending in a second direction that intersects with the first direction.

(8) The semiconductor device according to (7), in which the first semiconductor section includes a first bonding section and a first wiring line, the first bonding section including a plurality of the first electrodes, and the first wiring line being electrically connected to the first bonding section, the second semiconductor section includes a second bonding section and a second wiring line, the second bonding section including a plurality of the second electrodes, and the second wiring line being electrically connected to the second bonding section.

(9) The semiconductor device according to (8), in which the plurality of first electrodes are separately connected to the first wiring line.

(10) The semiconductor device according to (9), in which the plurality of second electrodes are separately connected to the second wiring line.

(11) The semiconductor device according to (8), in which the first bonding section includes a first extraction electrode connected to one end of each of the plurality of first electrodes, and the first extraction electrode is electrically connected to the first wiring line.

(12) The semiconductor device according to (8) or (11), in which the second bonding section includes a second extraction electrode connected to one end of each of the plurality of second electrodes, and the second extraction electrode is electrically connected to the second wiring line.

(13) The semiconductor device according to (8), in which
the first bonding section includes two first extraction electrodes, one of the two first extraction electrodes being connected to one end of each of the plurality of first electrodes, and the other being connected to the other end of each of the plurality of first electrodes, and at least one of the two first extraction electrodes is electrically connected to the first wiring line.

(14) The semiconductor device according to (8) or (13), in which the second bonding section includes two second extraction electrodes, one of the two second extraction electrodes being connected to one end of each of the plurality of second electrodes, and the other being connected to the other end of each of the plurality of second electrodes, and at least one of the two second extraction electrodes is electrically connected to the second wiring line.

(15) The semiconductor device according to any one of (7) to (14), in which both the first electrode and the second electrode are formed of Cu.

The present application claims priority to Japanese Priority Patent Application No. 2011-115634 filed in the Japan Patent Office on May 24, 2011 and Japanese Priority Patent Application No. 2011-129190 filed in the Japan Patent Office on Jun. 9, 2011, the entire content of which is hereby incorporated by reference.

The invention claimed is:

1. A light-detecting device, comprising:
a first substrate including:
a photodiode;
at least a portion of a microlens disposed over the photodiode; and
a first multi-layer wiring layer including a first insulating layer, a first electrode, and a second electrode, wherein a portion of the first insulating layer, the first electrode, and the second electrode are disposed at a first surface side of the first insulating layer opposite to a light incident surface side of the first substrate; and
a second substrate including:
a second multi-layer wiring layer including a second insulating layer, a third electrode, and a fourth electrode, wherein a portion of the second insulating layer, the third electrode, and the fourth electrode are disposed at a first surface side of the second insulating layer; and
a plurality of transistors,
wherein the first substrate and the second substrate are bonded to each other such that the first surface side of the first insulating layer and the first surface side of the second insulating layer are facing each other,
wherein the first electrode and the third electrode are bonded and electrically connected to each other, wherein the second electrode and the fourth electrode are bonded to each other, wherein a surface of the first electrode and a surface of the second electrode are coplanar with a surface of the first insulating layer, wherein a surface of the third electrode and a surface of the fourth electrode are coplanar with a surface of the second insulating layer, wherein a plurality of dummy electrodes including the fourth electrode are disposed in the first surface side of the second substrate and are disposed adjacent to at least two sides of the third electrode in a plan view, wherein the first electrode and the third electrode carry a signal for the light detecting device, wherein the first electrode is connected to a first wiring through a first via, wherein the first via is disposed in the first insulating layer, wherein the first wiring is disposed in a layer of the first multi-layer wiring layer that is distinct from the first insulating layer, and wherein each of the plurality of dummy electrodes is bonded to a corresponding dummy electrode disposed in the first surface side of the first substrate.

2. The light-detecting device according to claim 1, wherein, in the plan view, the third electrode overlaps the portion of the microlens, and wherein the signal includes charge generated by the photodiode.

3. The light-detecting device according to claim 1, wherein the third electrode is connected to a second wiring through a second via, wherein the second wiring is disposed in a layer of the second multi-layer wiring layer that is distinct from the second insulating layer, and wherein the second electrode and the fourth electrode are electrically isolated from the photodiode and from the first electrode and the third electrode.

4. The light-detecting device according to claim 3, wherein the first insulating layer is disposed between the first electrode and the second electrode, wherein the second insulating layer is disposed between the third electrode and the fourth electrode, and wherein theft portion of the first insulating layer and the portion of the second insulating layer are bonded to each other.

5. The light-detecting device according to claim 4, wherein the second electrode and the fourth electrode are bonded to one another at a first bonding surface, wherein the first insulating layer contacts a surface of the second electrode that is opposite to the first bonding surface, and wherein the second insulating layer contacts a surface of the fourth electrode that is opposite to the first bonding surface.

6. The light-detecting device according to claim 5, wherein the first insulating layer surrounds both sides of the second electrode, and the both sides of the second electrode are perpendicular to the first bonding surface, and wherein the second insulating layer surrounds both sides of the fourth electrode, and the both sides of the fourth electrode are perpendicular to the first bonding surface.

7. The light-detecting device according to claim 5, wherein the first electrode and the third electrode are bonded to one another at a second bonding surface, wherein the first insulating layer surrounds both sides of the first electrode, and the both sides of the first electrode are perpendicular to the second bonding surface, and wherein the second insulating layer surrounds both sides of the third electrode, and the both sides of the third electrode are perpendicular to the second bonding surface.

8. The light-detecting device according to claim 1, wherein the plurality of dummy electrodes are not electrically connected each other.

9. The light-detecting device according to claim 1, wherein the first, second, third, and fourth electrodes include Cu, and wherein the plurality of transistors include at least one of a transfer transistor, a reset transistor, an amplification transistor, or a selection transistor.

10. The light-detecting device according to claim 4, wherein the first and second insulating layers include $SiO_2$.

11. The light-detecting device according to claim 1, wherein surface areas of the first and second electrodes and the plurality of dummy electrodes of the first substrate occupy 50% to 60% of a surface area of the first insulating layer in which the first and second electrodes and the plurality of dummy electrodes are formed.

12. The light-detecting device according to claim 1, wherein the first and third electrodes have a same size, and wherein the plurality of dummy electrodes are closer to a peripheral region of the second substrate than the third electrode.

13. The light-detecting device according to claim 1, wherein the second and fourth electrodes have a same size, and wherein the plurality of dummy electrodes are coupled to a node that receives a potential.

14. The light-detecting device according to claim 1, further comprising:
a color filter disposed above the light incident surface side of the first substrate, wherein the microlens is disposed above a light incident surface side of the color filter.

15. The light-detecting device according to claim 1, wherein a width of the first electrode is larger than a width of the second electrode.

16. The light-detecting device according to claim 3, wherein the first electrode and the third electrode are bonded to one another at a bonding surface, wherein a surface of the first electrode opposite to the bonding surface is directly connected to the first via, and a surface of the third electrode opposite to the bonding surface is directly connected to the second via.

17. The light-detecting device according to claim 3,
wherein the first insulating layer includes a fifth electrode at the first surface side of the first insulating layer, and the second insulating layer includes a sixth electrode at the first surface side of the second insulating layer,
wherein the fifth electrode and the sixth electrode are bonded and electrically connected to each other,
wherein the fifth electrode is connected to the first wiring through a third via, and
wherein the sixth electrode is connected to the second wiring through a fourth via.

18. The light-detecting device according to claim 1, wherein the plurality of dummy electrodes are arranged in all regions other than a region including the second electrode.

19. The light-detecting device according to claim 1, wherein the first and second electrodes have a same size, and wherein, in the plan view, an entirety of at least one of the plurality of dummy electrodes is overlapped by the portion of the microlens.

20. The light-detecting device according to claim 1, wherein the layer of the first multi-layer wiring layer is physically separated from the first insulating layer.

* * * * *